(12) United States Patent
Kurtz et al.

(10) Patent No.: US 7,987,899 B2
(45) Date of Patent: Aug. 2, 2011

(54) MICRO-STRUCTURED COOLER AND USE THEREOF

(75) Inventors: Olaf Kurtz, Berlin (DE); Ralph Herber, Berlin (DE); Peter Prechtl, München (DE); Sven Theisen, Berg (DE); Markus Höhn, Oberhaching (DE)

(73) Assignee: Atotech Deutschland GmbH, Berlin (DE)

( * ) Notice: Subject to any disclaimer, the term of this patent is extended or adjusted under 35 U.S.C. 154(b) by 875 days.

(21) Appl. No.: 11/995,221

(22) PCT Filed: Jul. 12, 2006

(86) PCT No.: PCT/EP2006/006948
§ 371 (c)(1),
(2), (4) Date: Jan. 10, 2008

(87) PCT Pub. No.: WO2007/006590
PCT Pub. Date: Jan. 18, 2007

(65) Prior Publication Data
US 2008/0196875 A1    Aug. 21, 2008

(30) Foreign Application Priority Data
Jul. 13, 2005   (DE) .................. 10 2005 033 150

(51) Int. Cl.
*F28F 7/00* (2006.01)
*H05K 7/20* (2006.01)
(52) U.S. Cl. ...................... 165/80.4; 165/168
(58) Field of Classification Search .......... 165/168, 165/170, 80.4, 80.2, 104.33, 104.21; 361/699, 361/702, 700; 257/714, 715; 174/15.1
See application file for complete search history.

(56) References Cited

U.S. PATENT DOCUMENTS

| | | | | |
|---|---|---|---|---|
| 5,527,588 A | * | 6/1996 | Camarda et al. | 428/188 |
| 6,014,312 A | * | 1/2000 | Schulz-Harder et al. | 361/699 |
| 6,152,215 A | * | 11/2000 | Niggemann | 165/166 |
| 6,386,278 B1 | | 5/2002 | Schulz-Harder | |
| 6,409,072 B1 | | 6/2002 | Bruer et al. | |

(Continued)

FOREIGN PATENT DOCUMENTS

DE   10313685 A1   10/2003
WO   WO 98/41076 A2   3/1998

(Continued)

OTHER PUBLICATIONS

Roger Schmidt, Heat Transfer Engineering, 25(3), 3-12. 2004.
Vogel Vertag, W. Bohl, Technische Stroinungsiehre (Technical Fluid Dynamics), Kamprath-Reihe, 11. Ed., p. 131; Relevance is cited on p. 5 of the instant application.

(Continued)

*Primary Examiner* — Tho V Duong
(74) *Attorney, Agent, or Firm* — Paul & Paul

(57) ABSTRACT

For providing a particularly efficient micro-structured cooler intended more specifically for cooling electronic components, it is proposed to proceed in the following manner to build this cooler: providing a stack of at least two metal foils (1) comprising channels (2) for coolant and one base plate (5) adapted to be brought into thermal contact with the electronic component (4) through a thermal contact surface (6), said metal foils (1) and said base plate (5) being joined together so as to form a single piece of material, said channels (2) having a width b ranging from 100 to 350 μm, a depth t ranging from 30 to 150 μm, a mean spacing s ranging from 30 to 300 μm, residual foil thickness r remaining after formation of the channels (2) in the metal foils (1) ranging from 30 to 300 μm and said base plate (5) having a thickness g ranging from 100 to 1,000 μm.

24 Claims, 12 Drawing Sheets

U.S. PATENT DOCUMENTS

| | | | |
|---|---|---|---|
| 6,742,574 B2 * | 6/2004 | Sugito et al. | 165/104.21 |
| 6,865,081 B2 * | 3/2005 | Meyer et al. | 361/699 |
| 7,115,987 B2 * | 10/2006 | Holalkere et al. | 257/713 |
| 2004/0066625 A1 | 4/2004 | Meyer et al. | |
| 2006/0108100 A1 * | 5/2006 | Goldman et al. | 165/80.4 |
| 2007/0084585 A1 * | 4/2007 | Takagi et al. | 165/80.4 |
| 2007/0221364 A1 * | 9/2007 | Lai et al. | 165/80.4 |

FOREIGN PATENT DOCUMENTS

WO    WO 2004/032231 A2    4/2004

OTHER PUBLICATIONS

Incropera, Frank P. and Dewitt, David P.: Fundamentals of Heat and Mass Transfer, 4~ Edition, John Wiley & Sons, NV, 1996, p. 449.

* cited by examiner

MICRO-STRUCTURED COOLER AND USE THEREOF

The present invention relates to a micro-structured cooler for an item to be cooled and to the use of such a cooler for cooling electronic components, such as processors, more specifically central processing units (CPUs), and power electronics components.

Continuous increase in the performance of electronic components, for instance increase of clock frequencies in microprocessors, is associated with increased heat build-up in these components. Component miniaturization even further enhances this build-up. Thermal problems increase despite of the measures taken to minimize power loss in the processors. Also, increasing packaging density of the various components within the system in general, a server for example, results in ever more heat having to be dissipated from a volume becoming ever smaller. Performance and durability of the electronic components however depend on the maximum values for operating temperature and their fluctuation range. This results in the need to use high-performance compact cooling systems in order to ensure efficient local heat dissipation.

Currently, a modern processor releases for example 150 Watt in the form of heat on an area of 1 cm². This is much more heat than that generated by a burner of a kitchen stove (which is about 10 Watt/cm²). In order to dissipate this amount of heat, the most important cooling systems utilized are heat sinks, fans, combined with heat sinks, heat pipes, Peltier arrays and liquid-cooling systems. It is expected that the amount of heat to be dissipated in future will even further increase.

Currently, the most frequently used cooling technique for electronic components is ambient air cooling. In many applications, this technique has been found to be simple and cost-effective. For systems that require higher cooling performances, this principle is very uneconomical since they require air-conditioning systems with a correspondingly high output, which not only results in soaring costs of investment and operation, but is also problematic in terms of energy and environmental policy.

With the new generation of processors, which have a very high thermal output, air cooling also reaches its limits. In most cases, heat dissipation can still be ensured by increasing the output of the fan, this however increasing operating noise. Nowadays, 55 dB are already too much in business and household applications.

Compared directly with other cooling systems, liquid cooling systems made from metallic or ceramic materials offer the highest cooling output. This is mainly due to the high heat capacity of the cooling medium, water for example, and to its low viscosity. Recently, water coolers for microprocessors made from copper, aluminium and ceramics have been sold on the market. Today, all these products are characterized by the high manufacturing costs of non-industrial, small-scale production.

A liquid cooler for an IBM Power Chip is illustrated in: *Heat Transfer Engineering*, 25(3), 3-12, 2004. This cooler has a mini-channel structure, however, it is completely made from silicon and is directly bonded to the CPU.

WO 98/41076 A2 describes an apparatus for cooling electronic components the capacity of which is considerably increased over known coolers by a heat sink and in which the heat transfer coefficient and, as a result thereof, the overall heat conductance of which are described to substantially be improved. The document mentions in this context that the greatest pressure loss generated by the coolant liquid as it passes through the micro-structured heat sink occurs in the region of the distribution structures and of the connecting channels. To solve the problem, it is proposed to provide a cooler having a plurality of individual layers and consisting of at least one plate with numerous micro-channels and one distribution channel and further having an intermediate plate with connecting channels and one collecting plate with collecting channels, closed cooling channels being obtained once these plates have been provided with a common cover plate and base plate. The cooling medium in the cooling channels is introduced into the micro-structure heat sink through an inlet port and exits therefrom through an outlet port. The intermediate plate for the cooling medium forms a stepped and/or bevelled transition structure through which cross-sectional areas of the inlet and/or outlet port, which are each represented by a vertical section with respect to the surface through all the individual layers, successively merge with the cross-sectional area of the micro-channels. A cooler with cooling channels having a flow cross section of 0.3×10 mm is mentioned by way of example. In this cooler, a heat transfer coefficient of 8.5 Watt/cm²·K and a pressure loss of 0.5 bar at a volume flow rate of 500 ml/min is achieved. With these power data, this quite complex cooler only achieves about 10% of the cooling capacity required for an average CPU.

As contrasted with micro-reactors and micro-heat exchangers that are already in use in research and development projects as well as in pioneer industrial processes, the problem of designing electronic coolers still remains largely unsolved since "heat management" in a micro-reactor or micro-heat exchanger is fundamentally different from in a cooler, which has to dissipate heat from a surface.

In a reactor, heat generated in a flowing medium, i.e., within the reactor, must be dissipated or exchanged as fast as possible if one wants to approximate as closely as possible the ideal of an isothermal process. For this reason, attempts are made to keep the cross sections of the channels and the wall thickness between the channels as low as possible within the technical limits of a reaction procedure. It is a matter of fact that a reactor must also be optimized with regards to its design, for example with regards to flow resistance, flow rate, and so on. But the basic heat management principle is comparatively simple.

A closer examination reveals that this object, i.e., the dissipation of heat from a locally strongly heated surface, is a very complex problem. The difficulty encountered is that the actual source of the heat is located outside of the cooler. Therefore, the heat resistances within the three-dimensional structure of the heat sink, through which liquid is circulated, needs to be taken into consideration much more.

Finding a solution to this problem is made even more difficult by further specific demands in electronics (for example for cooling CPU components) since the heat needs to be dissipated with minimum cooling water and minimum pressure loss in the cooler. For it has been found that it is possible to increase cooling capacity using ever finer structures, i.e., ever smaller channel cross sections, to a limited extent only because of the resulting excessive increase in flow resistance.

This effect becomes an issue when a large amount of heat is intended to be dissipated through a small surface area without the flow resistance being allowed to increase too much. In this case, the cooling capacity cannot be increased by simply increasing the velocity of the flow of the cooling medium through increased pressure difference, as is to be expected. For application in PCs, servers and work stations, low pressure pumps are typically used, which generate a pressure of up to about 250 mbar for example. High-performance coolant pump systems for current micro-reactors operating under increased pre-pressure of 5 bar and more for example, are not acceptable here for cost reasons.

Another demand is that the cooler needs to have a shape adapted to the shape of the electronic component, i.e., the surface area of the cooler and the mounting surface area on the component should have the same size.

Finally, for large-scale application, it must be made certain that the manufacturing cost for the liquid cooler and the cooling system is not considerably higher than for air cooling.

To solve the afore mentioned problems, WO 04/032231 A proposes for the first time rules for constructing, designing and configuring micro-structured coolers.

The cooler described therein comprises a stack of at least two metal foils and one base plate that is to be brought into thermal contact with the item to be cooled through a thermal contact surface. The metal foils and the base plate are joined together in a material fit through suited bonding techniques, preferably by soldering. In the metal foils, there are coolant flow channels, the heat being dissipated through the coolant flowing there through. The channels in the metal foils have a width ranging from 100 through 2,000 µm, preferably from 200 through 500 µm. Testing has evidenced that, with all the other parameters remaining the same, the cooling capacity decreases strongly from a channel width of 800 µm and more and is no longer advantageous for high-performance applications. The channel depth ranges from 25 through 1,000 µm, preferably from 50 through 400 µm. At least one of the two geometry variables, channel width and channel depth, is preferred to be in the micrometer range and the hydraulic diameter: 4·A/U; A=cross sectional surface area, U=circumference (defined according to: *Technische Strömungslehre* (*Technical Fluid Dynamics*), Kamprath-Reihe, Vogel Verlag, W. Bohl, 11. Ed., page 131; Incropera, Frank P. and Dewitt, David P.: "*Fundamentals of Heat and Mass Transfer*", $4^{th}$ Edition, John Wiley & Sons, NY, 1996, page 449) should preferably range from 200 through 500 µm. The mean spacing between the channels in a metal foil ranges from 50 through 1,000 µm, preferably from 150 through 300 µm. If, moreover, the cross section of the channels is rectangular or almost rectangular, so that a web forms between the channels in the foil, this spacing is referred to as the "web width". Further, the residual foil thickness at the bottom of the channels ranges from 50 through 300 µm, preferably from 80 through 120 µm. The base plate of the cooler has a thickness ranging from 200 through 2,000 µm, preferably from 500 through 1,500 µm. In particular if the power density is required to be very high, all the parameters mentioned meet these demands to a particular extent if they lie within the preferred ranges. Further, the ranges indicated for the parameter fields apply particularly when Cu is used as the base material.

In one of the design variants indicated in WO 04/032231 A, the metal foils are disrupted, approximately on the height of the thermal contact surface, by at least one splitting chamber in the shape of a gap so that the metal foils are divided by said gap. This arrangement allows coolant, which flows into the splitting chamber from the top, to come into contact with the base plate approximately in the central region in which there is located the thermal contact surface. At one end, all the channels communicate with the gap. As a result, two groups of parallely oriented channels are provided. Further, two collecting chambers, communicating with all the channels at the other end thereof, are for example provided within the cooler. The collecting chambers are preferably communicating in such a manner that coolant from the splitting chamber is allowed to flow into the intersected flow channels and from there into the communicating collecting chambers.

This design however is limited by the manufacturing methods in terms of geometry. The lower range limits for the channel width, the channel depth and the channel spacing (the web width) are substantially imposed by the current demands placed upon the manufacturing process: If the values chosen for these geometry parameters are very small, it will be difficult to manufacture the cooler on a large scale since in such a case it is no longer possible to observe the tolerances needed. The manufacturing possibilities depend on the technology used so that the lower range limits may be even lower if the manufacturing technique is improved.

At present, the demands placed on improved cooling capacity however grow faster than the production possibilities for increasing the capacity of a cooler by narrowing the range limits.

It is therefore an object of the present invention to provide a microstructure cooler for an item to be cooled the cooling capacity of which is further optimized while the possibility of large-scale production is maintained.

It is another object of the present invention to provide a micro-structure cooler which gets by with a minimum of cooling water and/or with a minimum of pressure loss in the cooler such that flow resistance does not excessively increase upon flow of coolant through the cooler compared with conventional coolers.

It is still another object of the present invention to provide a micro-structure cooler the manufacturing cost of which is comparable with or even lower than that of conventional coolers.

It is still another object of the present invention to provide a micro-structure cooler the shape of which is adapted to an electronic component to be cooled.

The solution to these objects is achieved by the micro-structured cooler and by the use of the micro-structured cooler. Preferred embodiments of the invention are indicated in the subordinate claims.

The present invention relates to a micro-structured cooler used for cooling items through heat conductive contact. The invention relates more specifically to the use of such a cooler for cooling electronic components such as processors, for example central processing units (CPU) and power electronics components. In terms of construction/design, structure and bonding method, the micro-structured cooler of the invention is matched to large-scale manufacturing, thus making low-cost large scale manufacturing of the micro-structured cooler possible.

The cooler of the invention comprises a stack of at least two metal foils (metal sheets) and one base plate that is brought in thermal contact with the item to be cooled through a thermal contact surface (which is limited to the region in which the item to be cooled is contacting the cooler). The metal foils and the base plate are bonded together so as to form a single piece of material, using suited bonding techniques, preferably by soldering/brazing. In the metal foils, there are coolant flow channels, the coolant, such as water, flowing therein serving to dissipate heat. Preferably, the channels in the metal foils run parallel to each other.

As contrasted with WO 04/032231 A, and in accordance with the present invention, special ranges are selected for channel width b, channel depth t and channel spacing (web width) s (for definition of these and of other parameters, the reader is referred to FIG. 1). The realization of these parameters permits to obtain advantageous properties for the cooler:

The channels in the metal foils have a width b ranging from 100 to 350 µm, preferably from 200 to 300 µm. Testing has evidenced that, with all the other parameters remaining the same, the cooling capacity of the cooler decreases strongly from a channel width of 350 μm and more and is no longer advantageous for high-performance applications.

The channel depth t ranges from 30 to 150 μm, preferably from 50 to 120 μm.

The hydraulic diameter (definition as indicated herein above) should preferably range from 70 to 250 μm.

The mean spacing between the channels s ranges from 30 to 300 μm, preferably from 150 to 300 μm. The interval between the channels is referred to as "web" and the mean spacing between the channels s is also referred to as "web width".

Further, the residual foil thickness r at the bottom of the channels ranges from 30 to 300 μm, preferably from 50 to 250 μm, more preferably from 50 to 120 μm.

The base plate of the cooler has a thickness g ranging from 100 to 1,000 μm, preferably from 300 to 500 μm.

For all the parameters indicated, the objects mentioned are achieved to a particular extent if the values are within the preferred ranges, in particular if the power density required is very high. Further, the ranges indicated for the parameters apply in particular if Cu is used as the base material for the metal foils and the base plate, but will also be valid if other material is used instead.

For the choice of the most advantageous combinations of channel width b, channel spacing s and residual foil thickness r, the following preferred ratios between the parameters apply:

Ratio channel width b to mean spacing s between the channels:
from 1.5:1 through 2.5:1; preferably from 1.0:1 through 2.0:1

Ratio channel width b to residual foil thickness r:
from 1:1 through 5:1, preferably from 2:1 through 5:1

Another influencing variable is the aspect ratio of the channels, that is to say the ratio channel depth t to channel width b. At equal channel cross section, deep channels (high aspect ratio t/b) have a clearly positive effect on the heat transfer of the cooler. With the cooler of the invention, said aspect ratio depends on the limits of the respective etching process, with the maximum values for t/b that can be achieved ranging presently from 1:2 to 1:5.

Taking the afore mentioned dimension rules into consideration, the parameter values mentioned, that is the channel width b, the channel depth t, the channel spacing s, the residual foil thickness r and the base plate thickness g may be preferably optimized within the ranges indicated in such a manner that the thermal resistance $R_{th\_c}$ of the cooler (definition thereof given herein after) is minimized at a given flow rate, pressure loss, size of the thermal contact surface area and coolant temperature.

Further, the parameter values mentioned may also be optimized so that the thermal resistance $R_{th\_c}$ of the cooler at a pressure loss of 130 mbar is smaller than or equal to 0.05 K/W (Kelvin/Watt). The coolant temperature is approx. 50° C. and the CPU surface area, and as a result thereof, the thermal contact surface area is 12 mm×12 mm.

Further, the parameter values mentioned may also be set so as to obtain a ratio cooler cooling capacity to cooler volume of the cooler, i.e., a "compactness", of at least 10 W/cm$^3$, preferably of at least 60 W/cm$^3$.

Further, the parameter values mentioned may also be set so as to obtain a cooling capacity per volume and difference ΔT between the temperature of the thermal contact surface $T_{cs}$ and the mean coolant temperature $T_m$ of at least 1 W/(cm$^3$·K), preferably of at least 6 W/(cm$^3$·K).

Further, the parameter values mentioned may also be set so as to obtain a specific, pressure loss standardized cooling capacity of at least 0.1 W/(cm$^3$·K·l/min), preferably of at least 0.8 W/(cm$^3$·K·l/min) and even more preferably of at least 5 W/(cm$^3$·K·l/min).

Further, the parameter values mentioned may also be set so as to obtain a heat transfer capacity of 200 Watt at a difference ΔT between the temperatures of the thermal contact surface $T_{cs}$ and the mean coolant temperature $T_m$ not exceeding 10 K, at a coolant flow rate through the cooler of 1.2 l/min as well as at a pressure loss not exceeding 150 mbar. Here also, it is assumed that the thermal contact surface, i.e., the CPU surface to be cooled, is 12 mm×12 mm.

In the cooler of the invention there are further provided:
at least one splitting chamber traversing the metal foils approximately in the region of the thermal contact surface, said chamber communicating with a respective one of the inlet-side end of all or of selected channels through channel inlet ports;
at least one inlet chamber for the coolant to enter into the cooler, said chamber communicating with the at least one splitting chamber;
at least one collecting chamber traversing the metal foils, said chamber communicating with a respective outlet-side end of all or of selected channels through channel outlet ports; and
at least one outlet chamber for the coolant to exit the cooler, said chamber communicating with the at least one collecting chamber.

The cooler of the invention is characterized in that the cross sectional area of the channels in a channel layer adjacent the base plate is greater than the cross sectional area of the channels in a channel layer located in the stack on the side opposite the base plate. More specifically, the cooler of the invention is characterized in that the depth of the channels in a channel layer adjacent the base plate is greater than the depth of the channels in a channel layer located in the stack on the side opposite the base plate. This can be realized in particular by the fact that a first metal foil adjacent the base plate and the base plate are provided with channels and joined together in such a manner that the surfaces of the first metal foil and of the base plate comprising the channels are facing each other and that the channels in the first metal foil and in the base plate coincide. As a result, the channels forming conjointly in the base plate and in the first metal foil have a greater depth, and hence cross sectional area, than the channels in the other metal foils, inclusive of the channels in the metal foil located in the stack on the side opposite the base plate. Likewise, the width of the channels in a channel layer adjacent the base plate could be made larger than the width of the channels in a channel layer located in the stack on the side opposite the base plate. In either case, the cross sectional area or depth, respectively, of channels may be larger in one or two or three or even more channel layer(s) adjacent to the base plate compared to the cross sectional area or depth, respectively, of channels in channel layer(s) located on the other side of the stack of metal foils.

Accordingly, the cooler of the invention constitutes a specific improvement of the micro-structured cooler described in WO 04/032231 A.

By increasing the cross sectional area, more specifically depth, of the channels in the first (or further) metal foil(s) adjacent the base plate, the cooling capacity of the cooler of the invention is increased over that of the cooler known from WO 04/032231 A. This is due to the fact that the greatest cooling effect is achieved by the proximity to the thermal contact surface with the item to be cooled through coolant flowing in the channels of the first metal foil. Coolant flowing in channels in metal foils disposed farther away from the base plate will not participate in the cooling effect to the same extent. Therefore it is preferred that only the cross sectional area, more specifically depth, of the channels in the first channel layer be increased compared to the channels in all other channel layers. In the deeper channels in a first channel layer adjacent the base plate, the pressure loss for the coolant may either be reduced or the cooling capacity is increased at a given pressure loss. Since such an effect is stronger in the channels of the first metal foils than in the channels of the other metal foils of the stack, this very provision will permit to particularly efficiently optimize the cooling capacity of the cooler.

Since a first metal foil adjacent the base plate and the base plate are provided with the micro-channels and joined together in such a way that the surfaces of the first metal foil and of the base plate comprising the channels are facing each other and the channels in this first metal foil and in the base plate coincide, the channel depth of the first channel layer is obtained by summing up the depths of the channels of the base plate and of the first metal foil, which is bonded to the base plate so as to form a single piece of material. By doubling the channel depth, the depth of the first micro-channel layer may preferably range from 100 to 250 μm.

By having the base plate, as well as the first metal foil adjacent said base plate, provided with channels, and by having these joined together in such a manner that the joining together of both results in a channel structure of a greater depth, the cooler of the invention is very easy and cost-effective to manufacture. For this makes it possible to utilise for the first channel layer in the region of the base plate exactly the same manufacturing method as for the other channel layers. The channels with the greater depth are then merely formed by suitably stacking the base plate and the first metal foil.

In a particularly preferred embodiment of the invention, the at least one inlet chamber tapers toward the at least one splitting chamber and the at least one outlet chamber toward the at least one collecting chamber.

This developed implementation of the cooler of the invention also constitutes an improvement over the cooler known from WO 04/032231 A. As compared, with this known cooler, a special novel configuration of an inlet chamber and an outlet chamber is realized, this novel configuration increasing considerably the cooling capacity of the cooler of the invention, while keeping the possibility of large-scale manufacturing, which has already proved efficient.

The use of a specially formed inlet chamber and of a specially formed outlet chamber allows increasing the cooling capacity of the cooler to a surprisingly high extent, with the pressure loss being the lowest possible. Pressure loss can be set depending on the capacity of the pump.

The at least one inlet chamber tapers to an outlet-side width x that is at least equal to the width $b_{10}$ of the at least one splitting chamber ($x \geq b_{10}$). Further, the at least one outlet chamber also tapers to an inlet-side width y that is at least equal to the width $b_{11}$ of the at least one collecting chamber ($y \geq b_{11}$). To accommodate manufacturing tolerances, the widths x and y are preferably slightly greater than $b_{10}$ and $b_{11}$ respectively. This may be necessary in order to prevent the respective free cross section formed by the inlet chamber and the outlet chamber, respectively, at the transition to a respective one of the splitting chamber and the collecting chambers from not completely coinciding with the corresponding free cross section of a respective one of the splitting chamber and the collecting chambers. Should the manufacturing tolerances be very low, the outlet-side width x of the inlet chamber could be virtually equal to the width $b_{10}$ of the splitting chamber ($x=b_{10}$). Likewise, the inlet-side width y of the outlet chamber could, in such a case, be almost equal to the width $b_{11}$ of the collecting chamber ($y=b_{11}$). This could permit to achieve the formation of as few protruding edges as possible, which protruding edges could lead to turbulences and, as a result thereof, result in pressure loss.

Accordingly, in the design of the invention, the metal foils are preferably disrupted by at least one inlet-side splitting chamber (split channel design), approximately in the region of the thermal contact surface. This splitting chamber can for example split the metal foils in the form of a gap, with said metal foils being preferably split perpendicular to their plane.

The gap width $b_{10}$ of the splitting chamber may for example range from 50 to 2,000 μm. The splitting chamber may traverse the cooler substantially over the entire cross section, perpendicularly to the metal foils. In case the thermal contact surface is disposed approximately in the center of the base plate, the splitter chamber will also split the metal foils approximately in the center. Through this arrangement, coolant flowing into the splitting chamber from the top (if the base plate is at the bottom), also comes into contact with the base plate in the central region in which there is located the thermal contact surface. As a result, a flow type leading to increased heat transfer is achieved in this region.

The at least one inlet chamber communicates with at least one inlet neck and passes the coolant liquid entering the cooler through the inlet neck into the splitting chamber. The inlet chamber leads directly into the splitting chamber. Since the inlet chamber tapers toward the splitting chamber, the pressure loss within the cooler may be considerably reduced so that the cooling capacity is significantly increased.

Since the channels run preferably in the planes of the metal foils, all the channels are directed at their inlet-side end toward the splitting chamber and communicate therewith. In a preferred embodiment, two groups of substantially parallely extending channels communicating with the splitting chamber at their inlet-side end are provided.

Further, there is provided inside the cooler at least one outlet-side collecting chamber communicating with all the channels at the outlet-side end thereof. As mentioned, there is further provided at least one outlet chamber. The collecting chambers are preferably disposed in the region of confronting side faces of the cooler and extend substantially across the entire width of a respective one of the cooler side faces. Accordingly, the collecting chambers can traverse the metal foils like the splitting chambers. The collecting chambers may preferably be formed in a gap configuration with a gap width $b_{11}$. The collecting chambers preferably communicate with each other, for example through the outlet chamber. The collecting chambers lead into the at least one outlet chamber. The outlet chamber communicates with outlet necks through which the coolant is discharged from the cooler.

Thus, in a preferred embodiment of the invention, the coolant flows from the inlet neck into the inlet chamber, from the inlet chamber into the splitting chamber, from the splitting chamber into the channels that are intersected by the splitting chamber and the collecting chambers, and from there into the collecting chambers, from the collecting chambers into the outlet chamber and from the outlet chamber into the outlet neck. As a result, the coolant can be fed from an external cooling line through the inlet neck into the splitting chamber from where it flows into the coolant flow channels. The coolant is then fed into the collecting chambers and is discharged from there, through the outlet neck, into an external cooling line.

In a particularly preferred variant, there is provided to lengthen the webs between the channels so that they extend through the splitting chamber and/or through at least one of the collecting chambers in order to stabilize the metal sheets, in particular when the foils have a small thickness. As a result, the splitting chamber and the collecting chambers are disrupted by these webs.

In accordance with another preferred embodiment of the invention, the at least one inlet chamber has an inlet-side width m, with m not exceeding the cross section of the inlet neck. Likewise, the at least one outlet chamber has an outlet-side width n, with n not exceeding the cross section of the at least one outlet neck.

In a developed implementation of the invention, the channels enlarge toward the splitting chamber in the region of the channel inlets, with the shape of the channel inlets being more specifically chosen to be conical ("funnel shape"). The enlargement extends over a length E. The width of the channels tapers from a channel inlet port to the mean channel width b.

This provision also helps in further reducing the pressure loss of the coolant flowing in the cooler since the flow resistance of the coolant flowing from the splitting chamber into the channels is reduced.

It has been found particularly advantageous that the ratio spacing k between the channel inlet ports to channel width b ranges from 1.1 to 3. It is particularly preferred that b ranges from 1.2 to 1.8.

The length E, over which the enlargement of the channels extends, ranges from 100 to 2000 µm, preferably from 200 to 400 µm.

The channel design of the invention is based on only minimizing the cross section of the channels to an extent allowing laminar flow in the channels under operating conditions. Turbulences are only tolerated where the flow cross section is high, i.e., where the flow resistance is low. In this manner, the pressure loss of a cooler can be readily adapted to a respective application. As a rule, the way of proceeding is such that the geometry (channel width, depth and spacing) is at first roughly optimized within the ranges indicated by adjusting the surface area-to-volume ratio of the flow channels. A low surface area-to-volume ratio of the micro-structure, of 3,000 m$^2$/m$^3$ for instance, results, as a rule, in a low flow resistance but also in a lower heat transfer. If the surface area-to-volume ratio is very high, from 10,000 to 30,000 m$^2$/m$^3$ for example, the flow resistance increases strongly so that an optimum is preferably reached at a mean surface area-to-volume ratio.

It has been found that it is not enough to simply optimize the flow resistance and the surface area-to-volume ratio to optimize the capacity. In a micro-structured cooler of the invention, the heat source is located outside of the component and the heat is dissipated through the heat conducting metal structure and through the coolant. Accordingly, besides optimizing the flow conditions, it is also necessary to optimize the spatial structure of the cooler. Consequently, the object of the invention is solved both by optimizing a "hydrodynamic factor" responsible for the optimal flow conditions and a "structure factor" imposed by the design of the cooler.

The design parameters of the invention and their influence on the cooling capacity will be discussed herein after:

It has been found out that it is particularly advantageous to optimize the ratio channel width b to channel spacing (web width) s with regards to the afore mentioned optimization criteria, namely the pressure loss in the cooler and the difference between the temperature at the thermal contact surface on the base plate of the cooler and the mean coolant temperature in the cooler ΔT or the thermal resistance $R_{th\_c}$. Too large a ratio causes deterioration of heat transfer. Accordingly, this ratio (width b/mean spacing s) should preferably range from 1.5:1 to 2.5:1. Too large a ratio of channel width s to residual foil thickness r will have a similar effect. The ratio channel width/residual foil thickness should range from 1:1 to 5:1. Further, by minimizing the residual foil thickness r, the heat transfer between the discrete layers is improved.

Accordingly, the channel geometry parameters (channel width b, channel depth t, channel length) influence the pressure loss, i.e., the hydrodynamic factor, whereas the channel spacing s, the residual foil thickness r and the base plate thickness g influence the transfer of heat within the three-dimensional structure and outward to the thermal contact surface on the base plate (in the region of the cooling surface), i.e., the structure factor. The latter is moreover strongly dependent on the spatial arrangement of the channels and on the flow direction, i.e., on the design, as will be shown in the design examples discussed herein after.

As indicated above, the channel length l exerts an effect on the pressure loss. The longer the channels, the greater the pressure loss so that the cooling capacity at a given pressure loss drops. The channel length l should, as far as possible, be 1 to 5 mm greater than the lateral extension of the thermal contact surface, which is meant to be the sum of the lengths of the respective channels in the two channel segments formed by the disruption of the channels by the splitting chamber. The heat exchange surface defined by the channels in the metal foils is also preferably greater than the thermal contact surface. Effective heat transfer from the thermal contact surface on the base plate to the coolant in the channels is thus achieved.

The pressure loss occurring through swirl/turbulence in the entrance region and directly above the heat source at the thermal contact surface as well as the pressure loss generated during splitting and in-flow into the channels on either side, are compensated by shortening the channels and by doubling their number. This is due to the fact that the flow velocity of the coolant according to the Hagen-Poiseuille Law is proportional to the pressure loss (Δp) and that the flow velocity can be halved by doubling the number of channels and to the fact that the pressure loss is also reduced by halving the length of the channels, namely by 75% maximum.

The channels have what is called a "critical length" from which length the laminar flow has completely formed. In an inflow region, the velocity distribution can be described by an almost rectangular profile. In the last mentioned case, the pressure loss according to the Hagen-Poiseuille Law is greater, the heat transfer however, higher. As a result, the transition point between the inflow region and the region where laminar flow has completely formed needs to be optimized with an "inflow effect" in such a manner that the pressure loss is further controlled to remain at its minimum while heat transfer is further increased. In principle however, the channel length should be short in any construction.

From a "critical pressure loss Δp" as the minimum, the cooling capacity of the cooler falls. With the design measures described, this minimum can be further lowered on purpose.

A heat exchange surface defined by the channels inside the cooler which is larger than the thermal contact surface on the base plate has further been found advantageous. The flow channels in the cooler may for example form a more or less dense pattern in a metal foil and thus define a heat exchange surface as the surface occupied by the channels on the metal foils in which surface the heat flowing into the cooler is absorbed by the coolant. This heat exchange surface should be larger than the surface on the base plate through which the item to be cooled is in direct thermal contact with the cooler. Through this additional optimization measure, the heat is conducted from the item to be cooled through the thermal contact surface as directly and completely as possible to the flow channels and, as a result thereof, into the coolant liquid and not into the side walls of the cooler for example.

Another influencing variable is the aspect ratio of the channels, that is to say the ratio channel depth t to channel width b. At equal channel cross section, deep channels (high aspect ratio t/b) have a clearly positive effect on the heat transfer of the cooler. With the cooler of the invention, the aspect ratio depends on the limits of the respective etching process, with the maximum values for t/b that can be achieved ranging presently from 1:2 to 1:5.

The cooler of the invention contains at least two metal foils with flow channels. The channels are preferably organized in channel planes, the channel planes extending preferably within the metal foils. One single metal foil as well as, in addition thereto, one base plate provided with trenches to form flow channels can be utilized rather than two metal foils. Inasmuch, one of the two metal foils will then be referred to as the base plate, if it has channels.

The micro-structured cooler preferably has 2-10 planes for the channels. With regards to the indications made herein above, this means that either 1-9 metal foils and, in addition thereto, one base plate provided with channels or 2-10 metal foils and, in addition thereto, one base plate with no channels are provided. At least two channel planes are to be provided in any case.

The heat transfer capacity from the item to be cooled to the coolant increases with the number of channel planes. It has been found out though, that the heat transfer capacity can no longer be increased further, at least not to a noteworthy extent, if there are more than 10 layers having the same geometry. Different capacity ranges of the component can be set and the manufacturing cost additionally purposefully influenced by simply varying the number of layers. Since each channel plane increases the cost, a cooler will preferably be designed according to a desired application-related cost/capacity ratio. Using a galvanotechnical manufacturing method, the cost can be reduced considerably by reducing the surface area or the volume with the cooler capacity remaining sufficient by optimizing the design of the cooler in accordance with the application.

The purposeful choice of the design parameters and construction principles mentioned herein above permits efficiently reducing the pressure loss through the inventive design of the micro-structure and obtaining the lowest possible thermal resistance, which allows for efficient heat dissipation through the cooler.

As compared with the cooler known from WO 04/032231 A, a pressure loss on the order of 150 mbar may be tolerated in order to meet the high demands placed on heat dissipation capacity and required by the actual processor systems. Particular importance has been attached to minimizing the thermal resistance. The thermal resistance constitutes a quantity for the opposition offered to heat dissipation from a component. A reduced thermal resistance increases—in a manner analogous to electrical resistance—the efficiency and effectiveness of the component.

The thermal resistance of the cooler $R_{th\_c}$, based on the mean temperature of the coolant $T_m$, is defined as:

$$R_{th\_c}=(T_{cs}-T_m)/P$$

wherein:

$$T_m=(T_{inlet}+T_{outlet})/2=T_{inlet}+0.5 \cdot P/(C_p \cdot m_{flow})$$

$$T_{cpu}=T_m+P \cdot (R_{th\_c}+R_{th\_TIM2})$$

where
$T_{cs}$ is the surface temperature of the cooler at the contact surface to the CPU;
$T_m$ is the mean temperature of the coolant inside the cooler;
P is the cooling power supplied to the item to be cooled;
$T_{inlet}$ is the temperature of the coolant at the inlet to the cooler;
$T_{outlet}$ is the temperature of the coolant at the outlet from the cooler;
$R_{th\_TIM2}$ is the thermal resistance of a TIM2-intermediate layer for thermally contacting the item to be cooled, for example a CPU on the cooler (TIM: Thermal Interface Material);
$C_p$: is the heat capacity of the coolant;
$m_{flow}$: is the mass flow of the coolant.

FIG. 7 shows a schematic illustration of the connection between the cooler and the CPU with the relevant parameters needed for defining the thermal resistance.

While the inner thermal resistance of the very CPU and that of the interface material TIM2 depend on the specific properties of the materials and are not the subject matter of the present invention, the thermal resistance of the cooler $R_{th\_c}$ and, in connection therewith, the contact resistance to the CPU surface are intended to be minimized.

The specific thermal resistance of a layer having a layer thickness d ($R_{th\_TIM2}/d$) is a material-specific constant. The resulting resistance $R_{th\_TIM2}$ however is obtained from the product of specific resistance and thickness of the layer TIM2 and is thus extremely dependent on the achievable minimum layer thickness. As a rule, the TIM2 intermediate layer consists of a heat conductive paste. The heat conductivity of such pastes is lower by many orders of magnitude than that of metals from which the base material of the cooler base plate is made at the thermal contact surface. For this reason, the TIM2 layer between the CPU and the base plate of the cooler should be chosen to be as thin as possible. In terms of construction, this may be achieved in that a drain for the heat conductive TIM2 intermediate layer is provided on the side of the base plate that is turned toward the item to be cooled. On the side at which the base plate is fastened to the CPU (cooling surface), said base plate may more specifically have a channel-shaped structure, with the channels being open at the ends of the base plate and, as a result thereof, projecting beyond the thermal contact surface. By pressing the base plate onto the CPU in the region of the thermal contact surface, the paste is distributed very homogeneously over the entire surface and forms as thin as possible a layer between the base plate and the CPU. The channels thereby both exert a "draining effect" and prevent paste from accumulating in certain regions. In this way, heat conduction between CPU and base plate of the cooler is optimized.

Through these further design measures, the thermal resistance $R_{th\_TIM2}$ of the TIM2 intermediate layer can additionally be strongly reduced over known coolers and heat removal from a CPU significantly improved as a result thereof.

More specifically, the cooler of the invention can be manufactured using a method of the micro-structure technique. As used herein, micro-structure technique is understood to refer to a manufacturing method by which high-resolution structures in the micrometer range are formed as then can be produced in printed circuit board technology. Such methods comprise producing high resolution structure images such as by means of photolithographic process steps. Depending on the masks used, channels can be made using for example dry etching methods or wet chemical deep etching. Mechanical micro-manufacturing (such as micro-milling, micro-stamping, reshaping techniques or similar) is also possible, with methods analogous to those used for printed circuit boards being preferred. Such type methods are actually known. The reader is for example referred to the indications given in U.S. Pat. No. 6,409,072, more specifically to galvanotechnical methods by which the channels and perforations in the metal foils are formed by means of etching and metal deposition methods and by structuring methods utilized for this purpose during etching and metal deposition. Using the methods described in U.S. Pat. No. 6,409,072 for example, much finer channel structures can be made than with conventional technology.

The galvanotechnical methods preferably are methods analogous to those used in printed circuit board production and comprise the discrete process steps of: photolithography, structuring (preferably etching), metal-plating and bonding, preferably soldering/brazing. The analogy with methods of manufacturing printed circuit boards consists, on the one side, in that discrete layers of a complex three-dimensional structure are made according to the same methods that are also utilized for manufacturing printed circuit boards. The thus manufactured micro-structured foils are then stacked and bonded in a way similar to multilayers in the printed circuit board technique. The design, structure and soldering/brazing systems of the components are matched to this method so as to be manufacturable on a large scale, thus enabling cost-effective mass production of the micro-structured cooler. Existing lines, which, in most cases, need not be changed or to a negligible extent only, may be used. The advantages of the manufacturing method described consist in the use of already existing micro-structuring methods in the scalability for industrial mass production and very low cost. On the one side, this offers the great advantage of allowing resorting to an already proven technology of mass production in a new application of the cooler of the invention and on the other side of allowing easy combination and integration of method steps. Thus, for ensuring force-minimized mounting, the cooler can be mounted directly to the CPU for example without any additional retaining clamp, preferably by soldering/brazing or gluing.

For bonding the components, the layer thickness of the soldering/brazing system and the process parameters must be matched accurately to enable soldering/brazing in the laminating presses currently used in the printed circuit board technique. The reader is referred to U.S. Pat. No. 6,409,072 for possible bonding methods.

Using the micro-structure technique in accordance with the invention for manufacturing the cooler, the following properties can be obtained:
1. minimum pressure loss for the coolant in the cooler at a given value for the thermal resistance;
2. small difference from the imposed value for the pressure loss as compared with the coolers known in the art;
3. very high, reliable absolute tightness (vacuum tightness of up to $10^{-9}$ mbar·l/s) of the components against the surroundings, but also between the micro-channels, for optimizing the heat transport through complete, full metallic bond;
4. excellent pressure resistance of the cooler or solidity of the connections between the metal foils and the top and base plates;
5. very good corrosion resistance adapted to the field of application, with the possibility of electrochemically depositing anticorrosion layers;
6. high temperature resistance;
7. sediment-free, geometrically well defined, homogeneous channels.

The micro-structured cooler of the invention only has the metal foils and a correspondingly thin base plate that terminates the stack on the side turned toward the thermal contact surface for the item to be cooled. A separate top plate is no longer needed. A normal channel plate closes the cooler itself toward the top. On top thereof lies a splitting and connecting element which, as a rule, may be integrated in a mount for the cooler (retention mechanism). It may also be a slightly thicker channel plate foil for increasing the stability. For manufacturing the micro-structured cooler, the structure foils are provided with a base plate and bonded to form a compact component.

For feeding coolant into the cooler and for discharging coolant from the cooler, devices for connecting hoses are provided, for example connecting pieces (inlet necks, outlet necks) formed as an integral part by injection molding, soldering/brazing or integration. The hose or tube connecting elements may be directly integrated or variably screwed, soldered, pressed and/or glued. Liquid lines leading to the pumps and/or to external counter coolers are connected to these connecting pieces.

For a better understanding of the invention, the reader is referred to the Figs. In said Figures:

FIG. 1a is a schematic cross sectional view of a stack of a structured base plate and of three structured metal foils;

Figure 6:
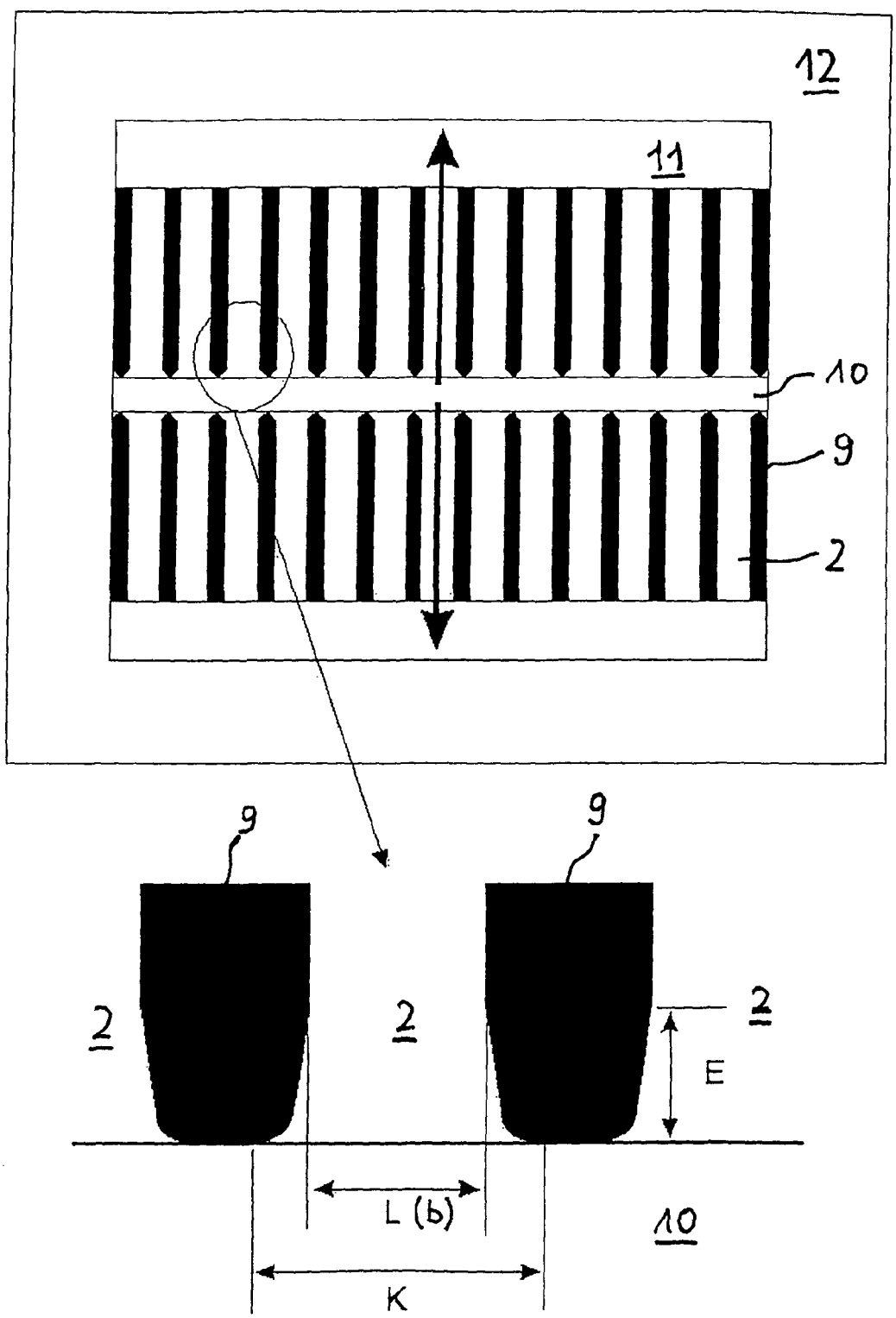
Figure 7:
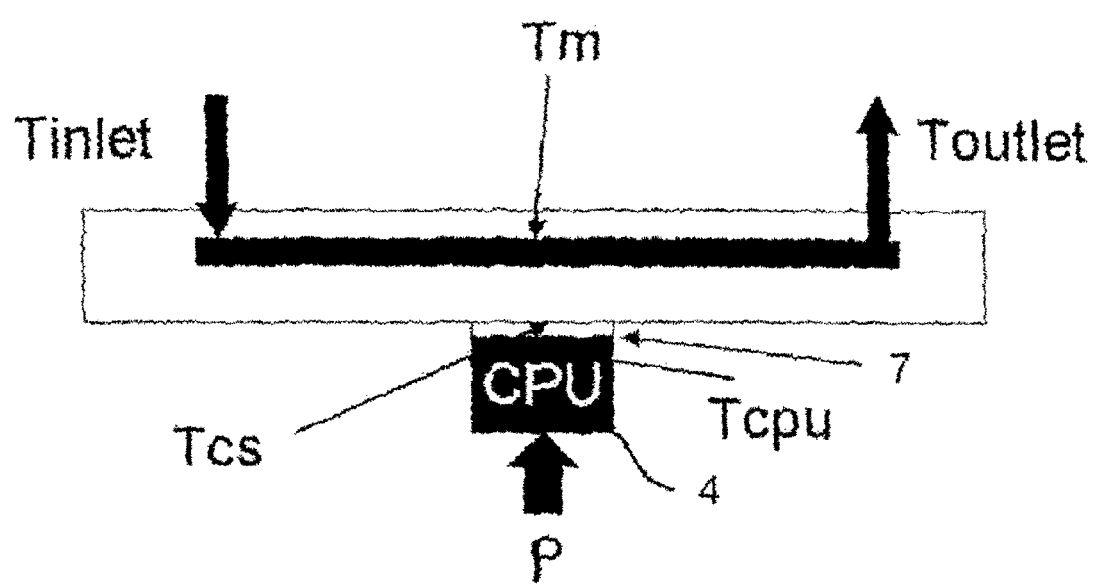
Figure 8:
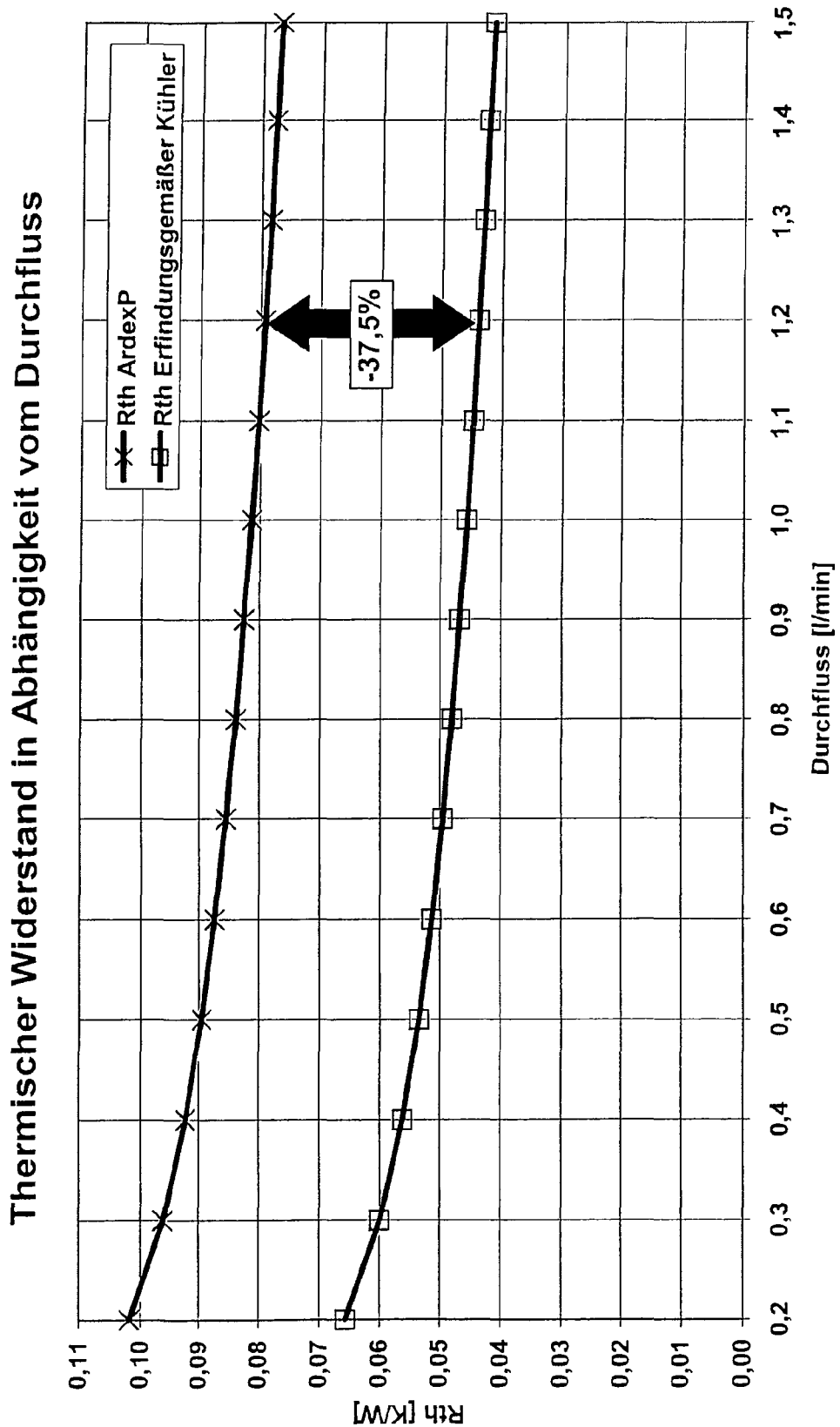
Figure 9:
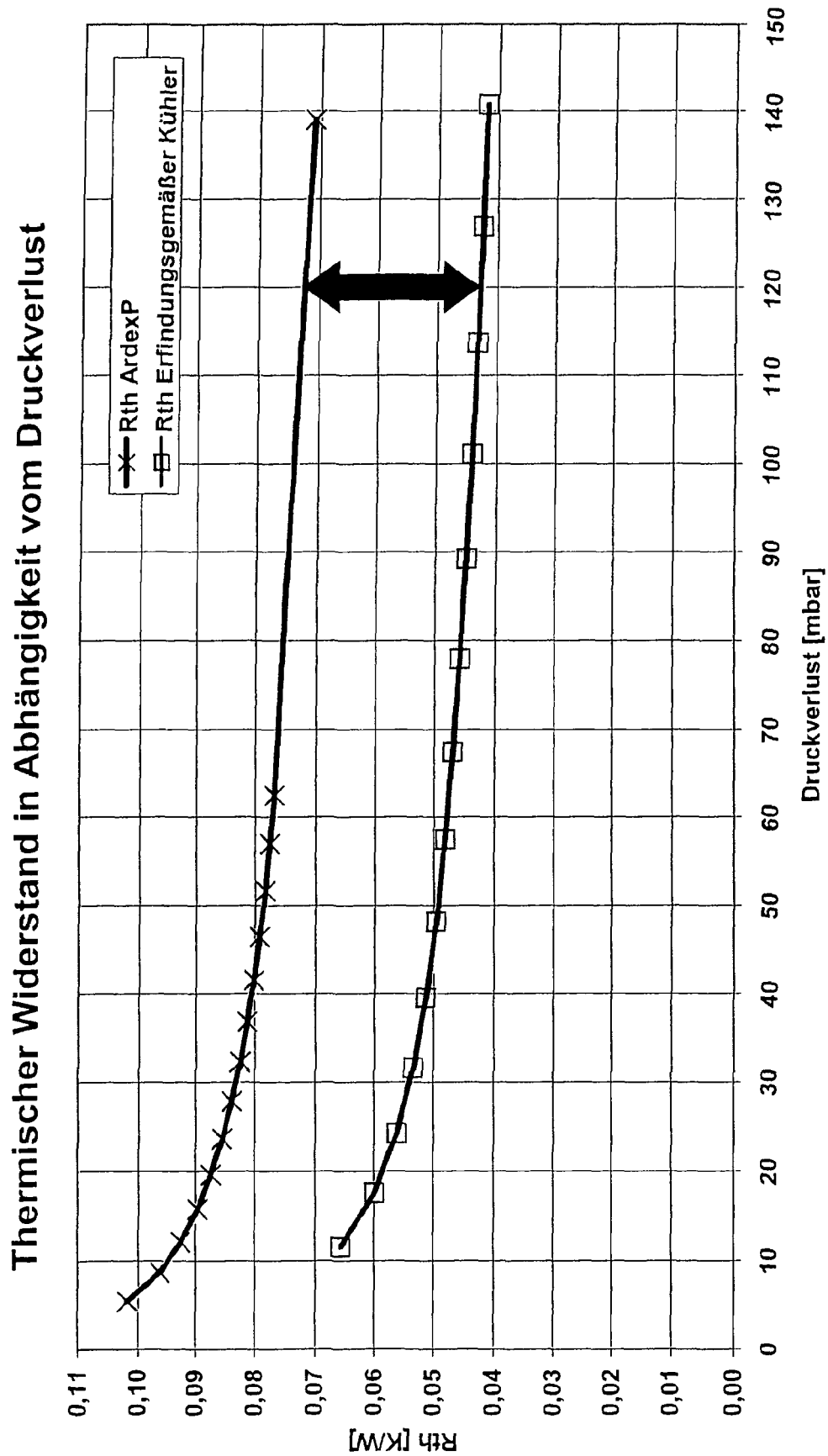

FIG. 6: is a schematic top view of a micro-structured cooler plane showing the detail of the funnel-shaped inlet region of a micro-channel;

FIG. 7: is a schematic representation of the connection between cooler and CPU with the parameters relevant to the definition of the thermal resistance;

FIG. 8 is an illustration of the dependency of the thermal resistance on the flow rate for a cooler of the invention as compared with prior art coolers;

FIG. 9 is an illustration of the dependency of the thermal resistance on the pressure loss for a cooler of the invention as compared with prior art coolers.

Like components and elements will bear the same reference numerals throughout the figures. The reader is also referred to the appended List of Numerals.

Figure 1:
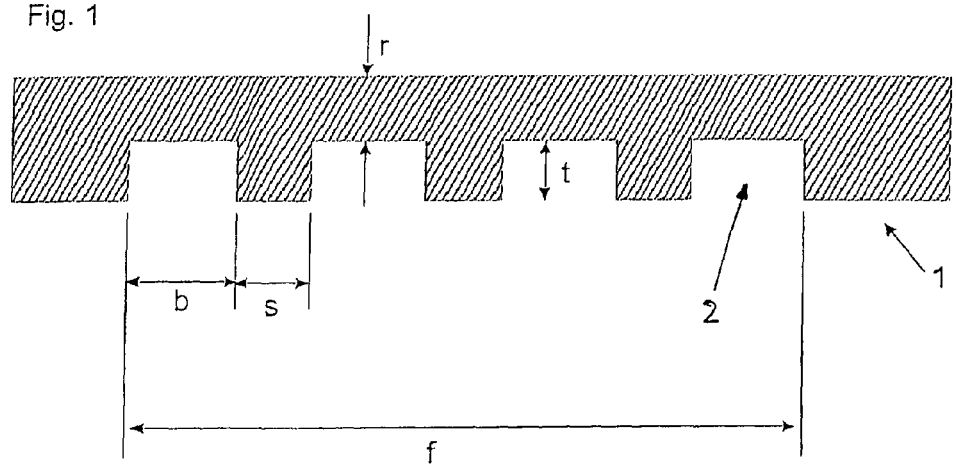
FIG. 1 is a schematic cross sectional view of a structured metal foil.
Figure 1:
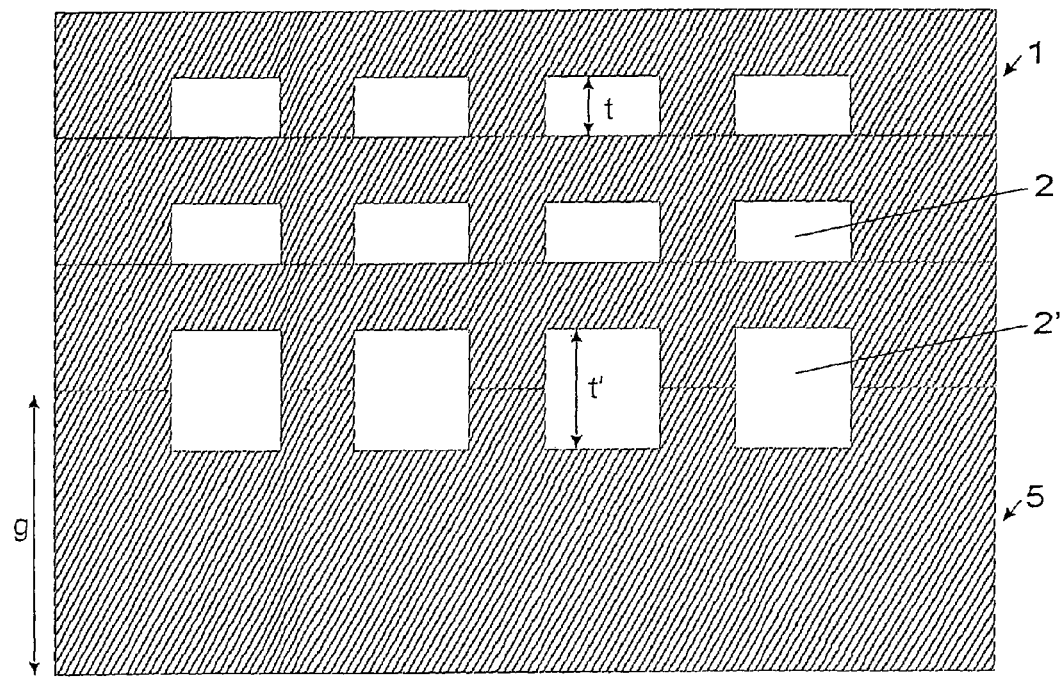

FIG. 1 shows discrete parameters on a metal foil 1 the optimization of which results in the minimization of the power loss in the cooler as well as in the minimization of the temperature difference between the thermal contact surface and the coolant flowing into the cooler or in the maximization of the cooling capacity. In the not yet soldered/brazed metal foil 1, the channels are shown as recesses 2. The parameters are the channel width b, the channel depth t, the channel spacing (web width) s and the residual foil thickness r. Moreover, the width f of the structured area is indicated on the metal foil 1.

FIG. 1a shows a stack of a structured base plate 5 and of three structured metal foils 1 joined together. The base plate 5 having thickness g has recesses formed therein which, together with respective recesses formed in an adjacent metal foil, form channels 2' in a first channel layer that is adjacent to the thermal contact surface at the base plate 5. The channels 2' in the first channel layer have a depth t'. Further two metal foils 1 are joined to the stack of the base plate 5 and first metal foil to form further channel layers with channels 2. These channels 2 have a depth t which is lower than depth t' in the first channel layer.

Figure 2:
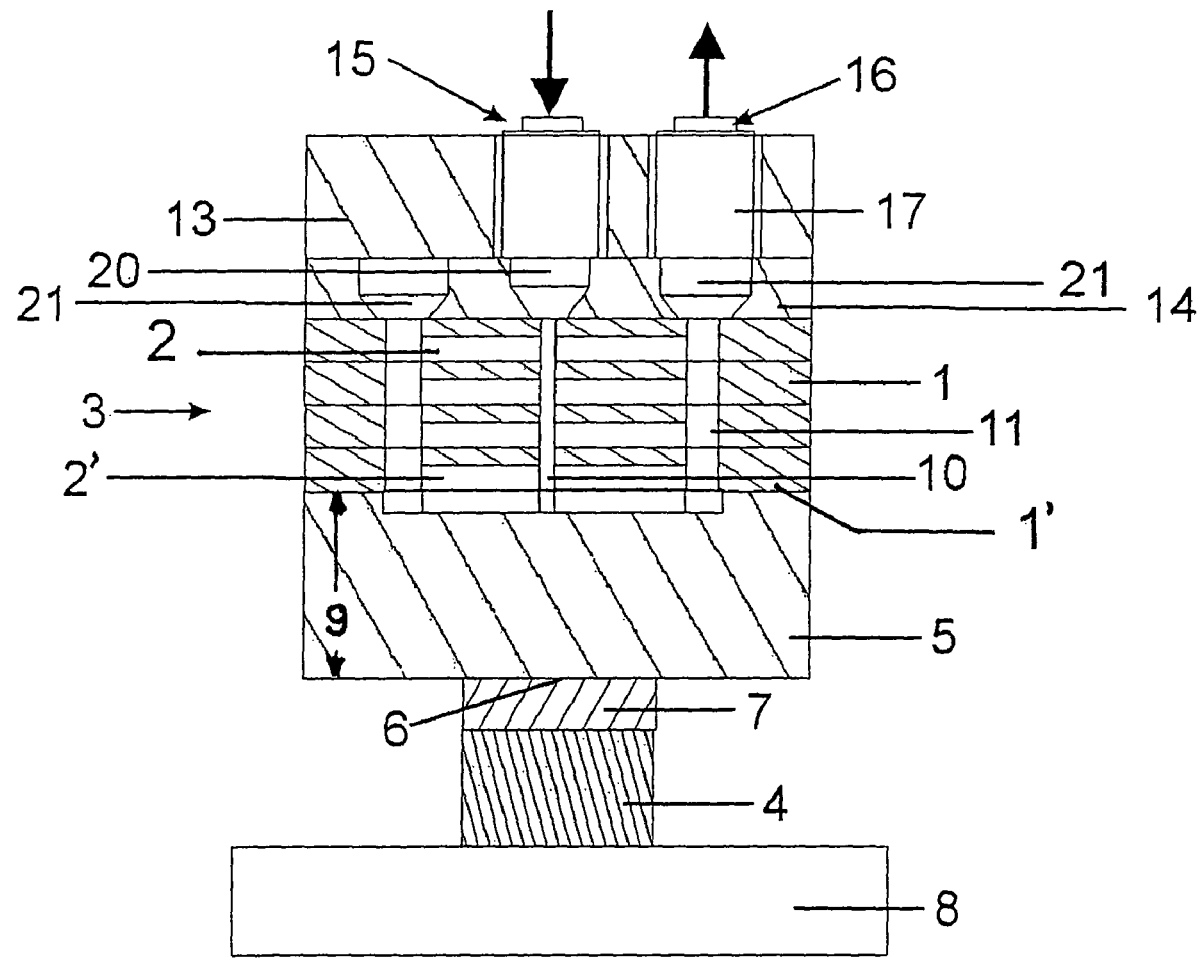
FIG. 2 is a schematic cross sectional view of a micro-structured cooler with a thermally contacted electronic component.

FIG. 2 shows a cooler 3 with thermally contacted CPU processor 4. In this case, the cooler 3 consists of four metal foils 1, each of these foils having for example four cooling channels 2. Webs located between the channels are not visible in the drawing. The channels 2 of each metal foil 1 are closed at their end. Toward the CPU processor 4, the cooling channels of the lowermost metal foil 1' are closed by a base plate 5 having a base plate thickness g. The base plate is also provided with channels that are caused to coincide with the channels of the adjacent metal foil 1' so that a common structure of channels 2' is formed there.

The base plate 5 serves to absorb the heat generated by the CPU processor 4 through a thermal contact surface 6. For this purpose, the CPU processor 4 is contacted in the region of the thermal contact surface 6 with the base plate 5 through a bonding agent with good thermal conductivity (such as a heat conducting paste, solder, conductive glue) 7. The CPU processor 4 is mounted to a CPU support plate 8.

A vertically oriented splitting chamber 10 traverses the metal foils 1 approximately in the center thereof. The splitting chamber is configured to be a gap extending normal to the plane of the drawing and intersecting the channels 2. Further, two collecting chambers 11 also traverse the metal foils approximately at right angles. The channels also open out into these collecting chambers.

The stack of metal foils 1 and base plate 5 is terminated by a cover plate 13 located on the top. There is further provided a splitting element 14 that may be configured to be a discrete element or integrated in the cover plate 13. In the splitting element, there are provided an inlet chamber 20 as well as two outlet chambers 21. The inlet chamber communicates with the splitting chamber 10 and the collecting chambers 11 with the outlet chambers. From the illustration, it is obvious that the inlet chamber and the outlet chambers taper toward the splitting chamber and toward the outlet chambers, respectively, in a manner in accordance with the present invention. In the cover plate, there are provided connecting pieces, namely an inlet neck 15 and an outlet neck 16. The inlet neck communicates with the inlet chamber and the outlet neck with the outlet chamber.

Coolant from an external cooling circuit enters the cooler 3 through the inlet neck 15 and reaches the inlet chamber 20 through the neck. From the inlet chamber, the coolant is fed into the splitting chamber 10 from where it directly flows into all the channels 2, 2'. From the illustration it can be seen that the coolant flowing downward in the splitting chamber reaches directly the base plate 5 where significant cooling effect is achieved. After it has passed through the channels, the coolant flows into the collecting chambers 11 from where it is circulated through the outlet chambers 21 to the outlet neck 16. From there, the coolant flows again into the external cooling circuit.

The FIGS. 3a through 3d show a schematic top view of metal foils with channels 2 contained therein and interposed webs 9. The channels are arranged parallel to each other and are located within a region referred to as the heat exchange surface. This region is defined by the area covered by the channels 2.

The splitting chamber 10 serves to minimize the pressure loss within the micro-structured channels and, as a result thereof, the required flow rate of the coolant with regard to reducing the size of the cooler and of the entire cooling system, inclusive of a coolant pump and the liquid hoses, and to optimizing them. Approximately in the region of the thermal contact surface, the metal foils 1 are disrupted by the splitting chamber ("split channel design").

In the FIGS. 3a through 3d, the splitting chamber 10 in one cooler plane is shown as a gap that intersects the channels 2 and the webs 9 between the channels.

All the channels 2 communicate with the splitting chamber 10. Whilst the channels 2 are only partly recessed from the metal foil 1 shown in FIG. 3a so that a residual foil thickness remains in the metal foils, the gap 10 constitutes a slot that extends through the metal foil 1. On superimposing a plurality of such type metal foils, channels 2 for receiving the coolant are formed that extend within the metal foil planes. The splitting chamber formed by the gap, by contrast, extends over the entire inner region of the cooler.

Further, FIGS. 3a through 3d show that the channels 2 open out into collecting chambers 11 at their outer ends. The coolant exiting the channels 2 enters the collecting chambers from where it is evacuated through the outlet chamber and the outlet neck (FIG. 2). The outlet chamber is located above one of the collecting chambers. This way of circulating the coolant makes it possible to achieve excellent cooling capacity.

Figure 3:
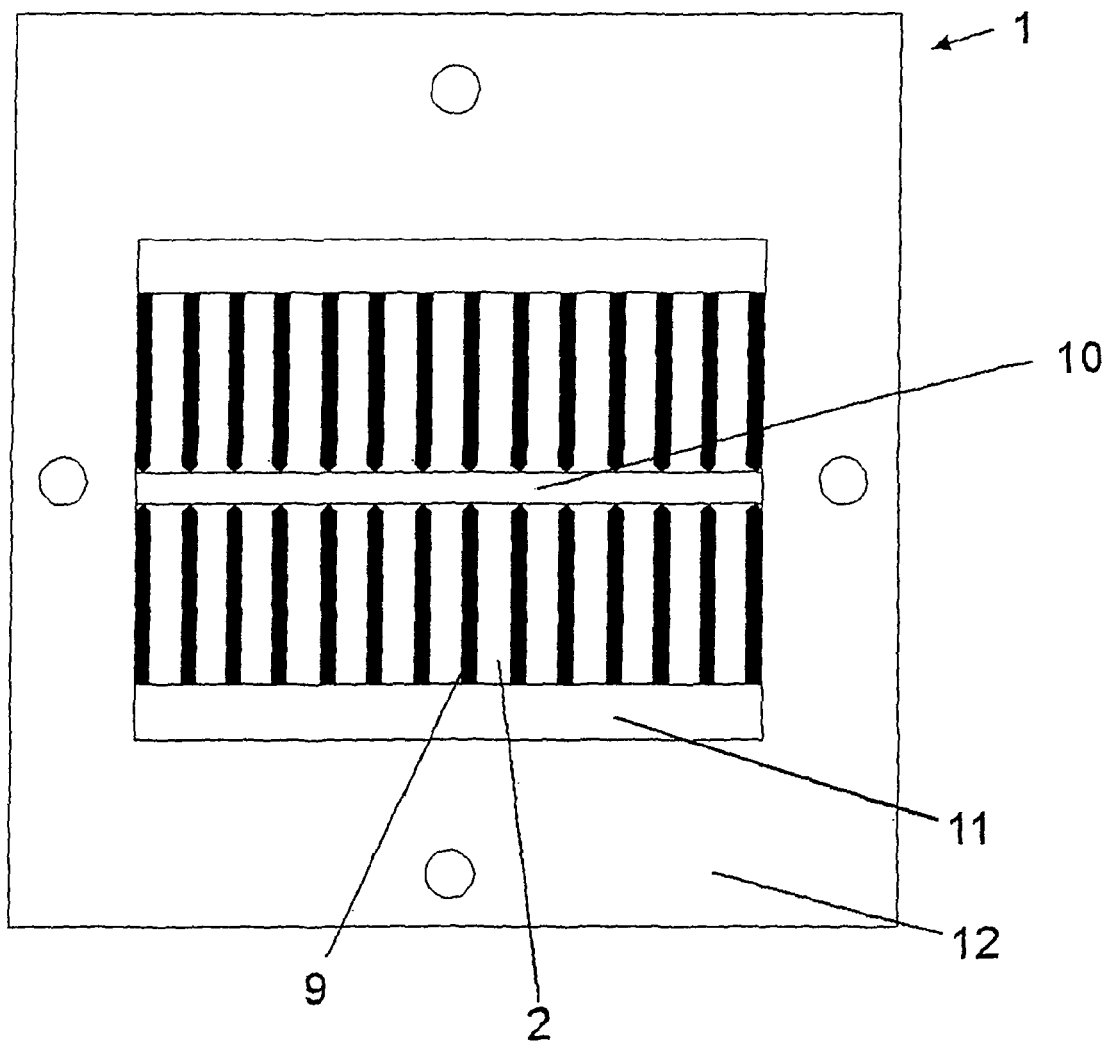
FIG. 3a is a schematic top view of a micro-structured cooler plane.
FIG. 3b is a schematic top view of a micro-structured cooler plane, in which every second web between the channels is lengthened as stabilizing element so as to extend beyond the splitting chamber and the collecting chambers.
FIG. 3c is, like FIG. 3a, a top view with staggered channels.
FIG. 3d is, like FIG. 3b, a top view in which all the webs between the channels are lengthened so as to extend beyond the splitting chamber and the collecting chambers.
Figure 3:
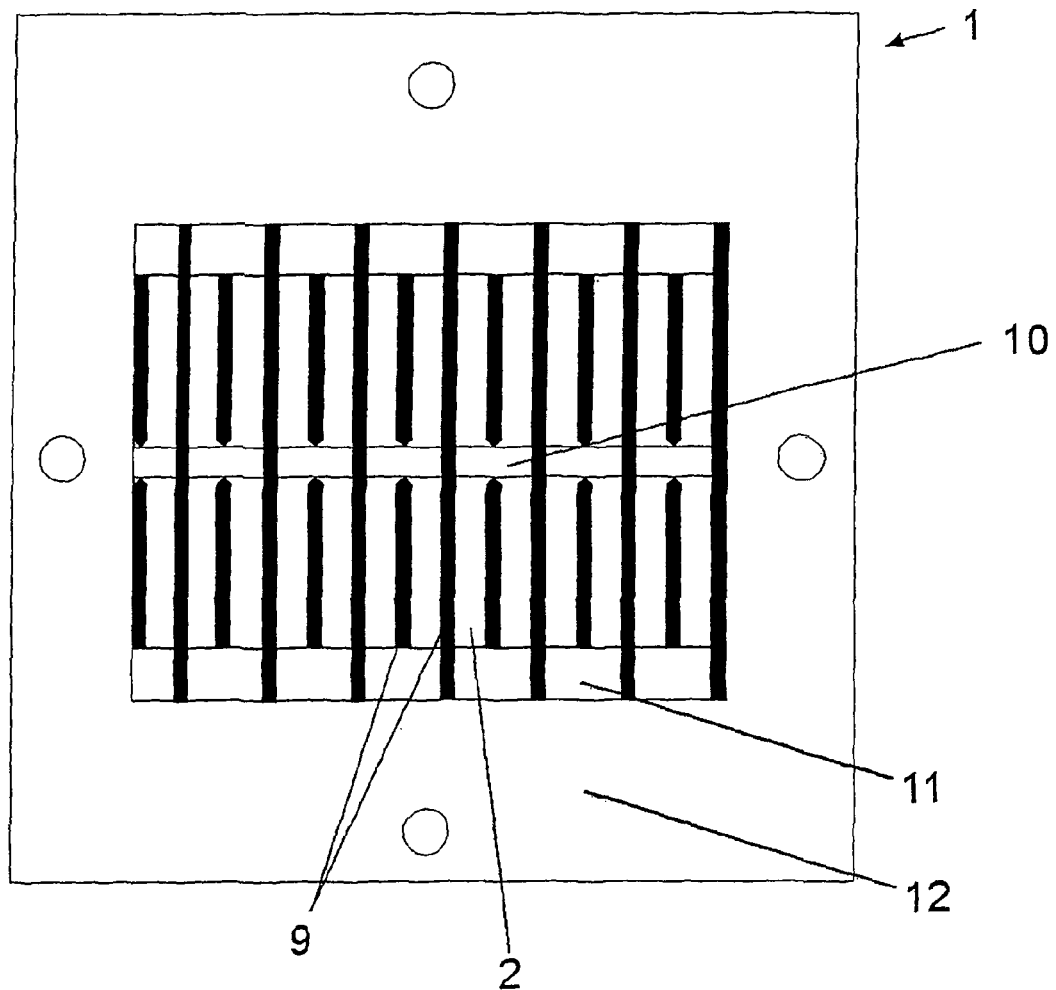
Figure 3:
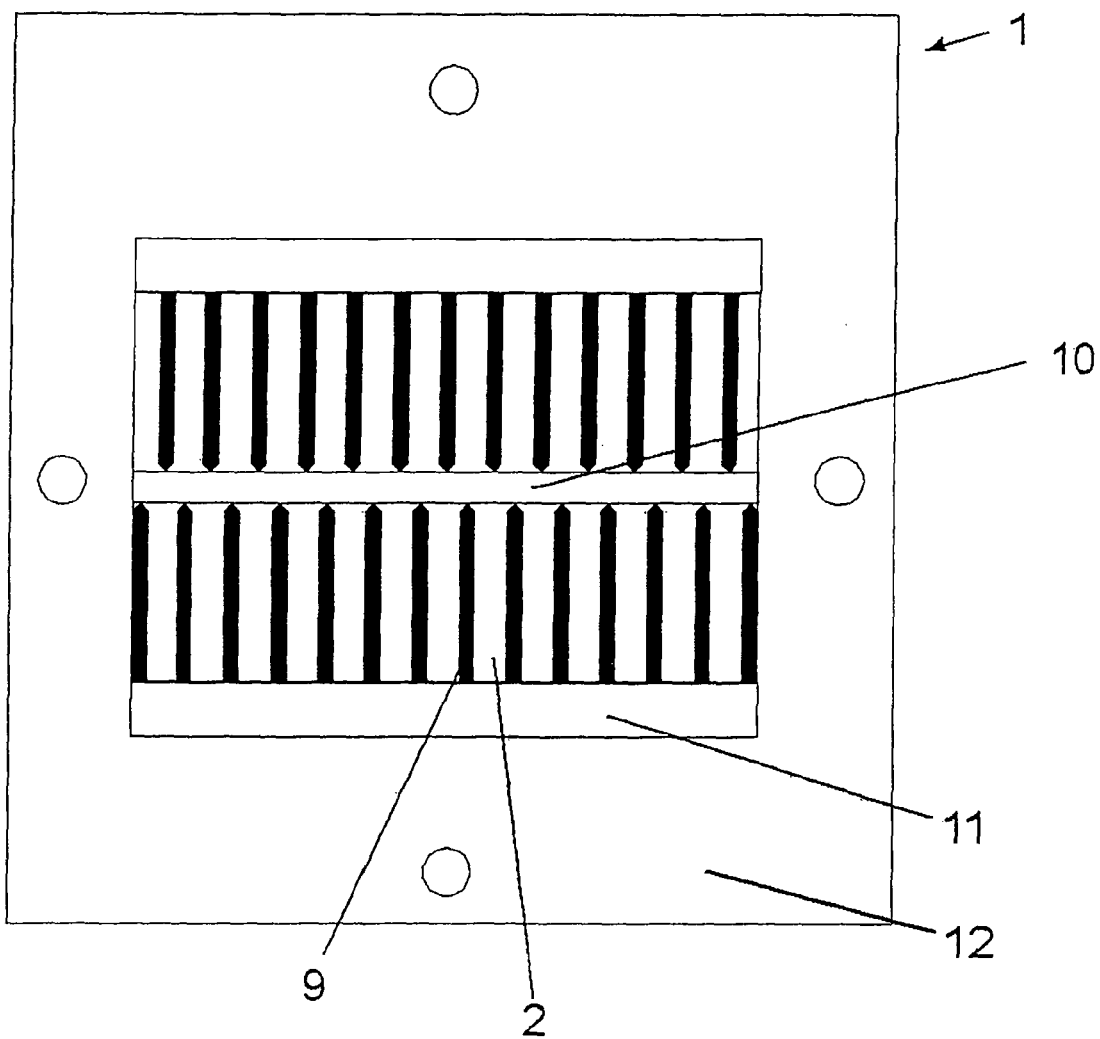
Figure 3:
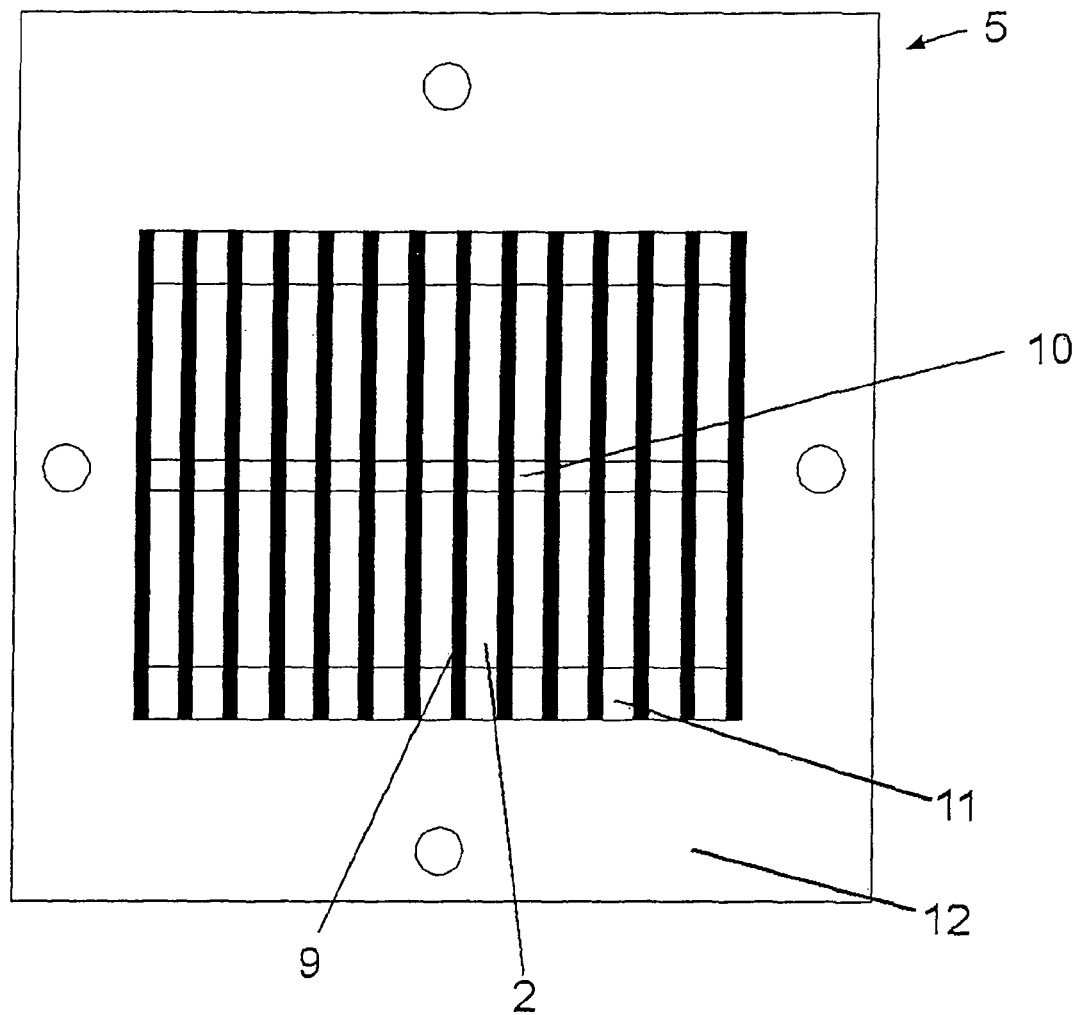

In FIG. 3a, the splitting chamber 10 and the collecting chambers 11 are completely penetrated. Moreover, the channels 2 are located directly opposite each other.

A variant of the split channel design of the invention is illustrated in FIG. 3b. The difference from the design shown in FIG. 3a is that every second web 9 between the channels 2 extends beyond the splitting chamber 10 and the collecting chambers 11 so that the splitting chamber and the collecting chambers are disrupted. This increases the mechanical stability of the design and is particularly preferred when the metal foils have a small thickness.

For discharging coolant from the cooler, there may be provided two connecting pieces (FIG. 2) through which the coolant is discharged. After passage through the channels 2, the coolant flows through the outlet-side collecting chambers 11 into the outlet chamber from where it flows out of the cooler.

Another variant of a metal foil 1 provided with channels 2 and webs 9 extending therein between is shown in FIG. 3c. In this case also, a splitting chamber 10 from which the channels branch and collecting chambers 11 into which the channels open out traverse substantially the entire cooler so that coolant can be recirculated from the splitting chamber into the channels and back from there through the collecting chambers.

The arrangement of the channels 2 and the webs 9 in the heat exchange surface differ from the one shown in FIG. 3a by the fact that the channels and webs of the two channel regions separated from each other by the splitting chamber 10 are offset relative to each other. As a result, the behaviour of the impinging flow is improved, which results in a reduced pressure loss so that heat transfer is still further improved.

In yet another variant, all the webs 9 between the channels 2 extend both through the splitting chamber 10 and through the collecting chambers 11, as shown in the illustration in FIG. 3d. This distinguishes this embodiment from the one shown in FIG. 3b where only every second web extends through the splitting chamber and the collecting chambers. This embodiment is even more robust than the one shown in FIG. 3b.

Figure 4:
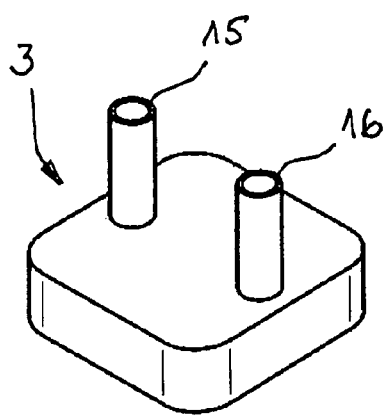
FIG. 4a is a perspective view of a micro-structured cooler.
FIG. 4b is a perspective view of a cooler cover with inlet chamber and outlet splitting chamber.
FIG. 4c is a sectional view of the cooler cover taken along the line A-A of FIG. 4d.
FIG. 4d is a top view of the cooler cover.
FIG. 4e is a sectional view of the cooler cover taken along the line B-B of FIG. 4d.
Figure 4:
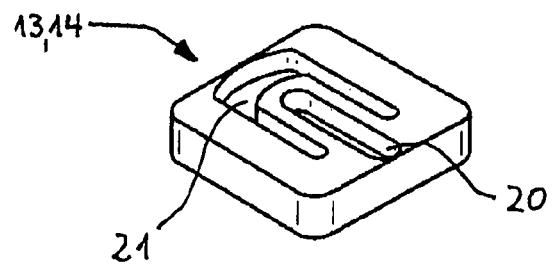
Figure 4:
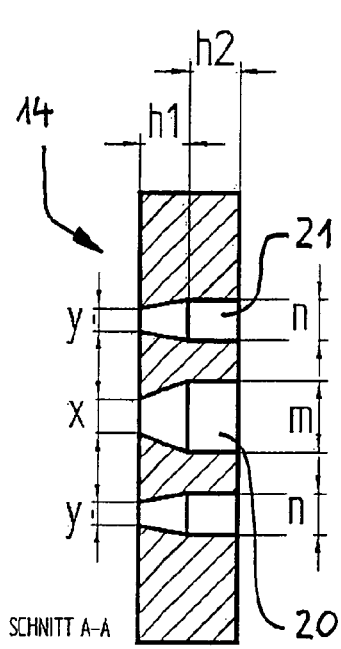
Figure 4:
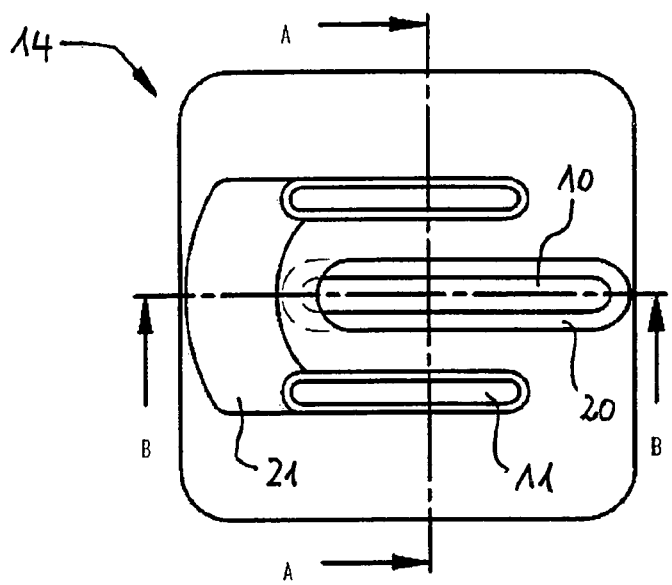
Figure 4:
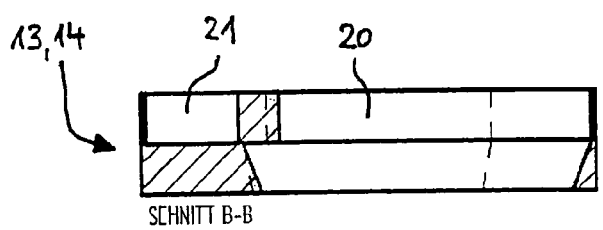

In FIG. 4a, the micro-structured cooler 3 of the invention is shown in a perspective view. The thermal contact surface for thermal connection of a CPU is located on the bottom side and is not visible in the FIG. On the top side, the inlet neck 15 and the outlet neck 16 are visible.

A detailed illustration of a splitting element and of a cover element is shown in the FIGS. 4b to 4e. In various illustrations, the splitting element and the cover element are not graphically shown separately.

FIG. 4b is a perspective illustration of this splitting and cover element 13, 14. In the cover element, recesses are visible, which represent the inlet chamber 20 and the outlet chamber 21. The inlet chamber extends approximately in the central region of the cooler so that it may communicate with the splitting chamber. The outlet chamber is configured in the shape of a U the two branches of which are located in the side regions of the cooler 3, thus being allowed to communicate with the collecting chambers also disposed there. The outlet chamber has two outlet ports, which extend over the entire channel length on either side surface of the cooler. The collecting chambers communicate through the U-shaped configuration of the outlet chamber.

The transitions from the inlet chamber 20 to the splitting chamber 10 and from the outlet chamber 21 to the collecting chambers 11 are designed in such a manner that they taper toward the splitting chamber and toward the collecting chambers, respectively. In the present case, they have a conical shape. This is shown in FIG. 4c. This Figure shows a cross section of the splitting and cover element 13, 14 along a line A-A according to FIG. 4d.

The inlet chamber 20 has a top width m which preferably corresponds to the cross section of the inlet neck for the coolant (FIG. 5), 7 mm in the present case. The inlet chamber tapers toward the splitting chamber to the width x, 3 mm in the instant case. The outlet chambers 21 also have tapering ports. These ports have a top width n, which preferably corresponds to the cross section of the outlet neck for the coolant, 7 mm in the present case. The ports of the outlet chambers taper toward the collecting chambers to the width y, 3 mm in the instant case. The regions of the inlet chamber and of the outlet chambers, which have substantially vertical side walls, have a height $h_2$, while the regions in which the chambers mentioned taper, have a height $h_1$.

Such a splitting and cover element 13 can be used in a cooler that has a splitting chamber with a width $b_{10}$ of 0.7 mm and collecting chambers with a width $b_{11}$ of 1.5 mm. In such a case, the channel width b can be 3 mm.

FIG. 4d shows a top view of the splitting and cover element 13, 14. Approximately in the center region, the inlet chamber 20 is shown with the conical taper toward the splitting chamber 10. The left end of the inlet chamber is covered by an overlap in the region of the cover element 13, and is shown by a dashed line only for this very reason. There is also shown the U-shaped region of the outlet chamber 21, which is also visible as a recess in the splitting and cover element. In the legs of the outlet chamber, the conical tapers toward the collecting chambers 11 are visible.

FIG. 4e shows another section through the splitting and cover element 13, 14, in this case along a line B-B of FIG. 4d. In the right region of the section, there is shown the inlet chamber 20, which is defined by vertical walls, said chamber tapering downward where it opens out into the splitting chamber (not shown). In the left region of the sectional view, the connecting part of the U-shaped outlet chamber 21 is shown.

Figure 5:
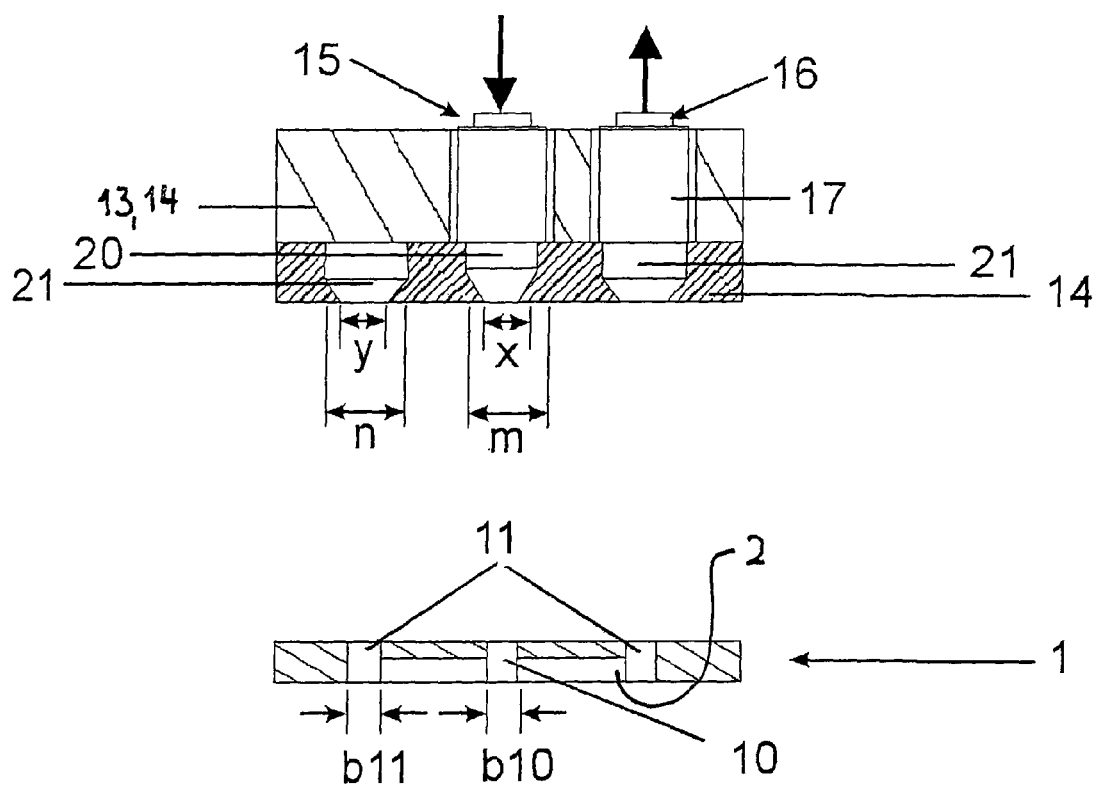
FIG. 5 is an illustration of the inlet and outlet region of the cooler in a cross sectional view showing the detail of a channel layer.

FIG. 5 shows the splitting and cover element 13, 14 as well as a channel layer which joins said element there beneath and is illustrated at a distance from the splitting and cover element, again in a sectional view. The various elements have already been discussed.

From this illustration it can be seen that the inlet chamber 20 tapers from a width m corresponding to the cross section of the inlet neck 15 to a width x, which in turn corresponds to the width $b_{10}$ of the splitting chamber 10. Likewise, it can also be seen from this Fig. that the outlet chambers 21 taper from a width n corresponding to the cross section of the outlet neck 16 to a width y, which in turn corresponds to the width $b_{11}$ of the collecting chambers 11.

It should be noted here that the width x is at least equal to the gap width $b_{10}$ of the splitting chamber 10. The width x is preferably slightly larger than the width $b_{10}$ in order not to hinder the coolant flow through mounting tolerances when the inlet chamber 20 and the splitting chambers are not exactly superimposed.

Likewise, the width y is at least equal to the gap width $b_{11}$ of the collecting chambers 11. The width y is preferably slightly larger than the width $b_{11}$ in order not to hinder the coolant flow through mounting tolerances when the collecting chambers 11 and the outlet chamber 21 are not exactly superimposed.

Beside the splitting chamber 10 and the shape of the inlet chamber 20 and of the outlet chamber 21, the conical shape of the funnel-shaped channel inlet shown in FIG. 6 and realized specially in a manufacturing process contributes to reduce the pressure loss.

For this purpose, FIG. 6 shows the metal foil 1 with channels 2 and interposed webs 9 as well as with a splitting chamber 10 and collecting chambers 11 already illustrated in FIG. 3a. Arrows additionally indicate the direction of the coolant flow through the channels. An enlarged detail view in the lower portion of the illustration shows the funnel-shape of the channel inlet with a channel inlet opening. The regions shown in black represent webs 9 between the channels 2. In the lower portion of this detail view, the splitting chamber 10 is visible. In this case, coolant enters the channels from the bottom.

The taper of the entrance region into the channels 2 in the direction of the coolant flow (k>l=b) reduces the flow resistance as the coolant enters the micro-channel. This restriction of the channels to the mean width b extends into the channels over a length E.

This shape of the channel inlets may for example be achieved by the special choice of the etching conditions for structuring. The channels 2 may for example be formed by etching in a commercial system, for example by Chemcut, USA. For this purpose, copper blanks (dimensions: 610 mm×480 mm) are structured with a Cu(II)-chloride solution at a concentration of 3 mol/l at a temperature of 50° C., a spray pressure of 2 bar and a conveyor speed of 0.6 m/min, with the portions that are not to be etched (webs, border of the metal foil) being masked with an etch resist during etching.

The shape of the inlet into the channels is preferably set so that the ratio k/l ranges from 1.1 to 3, more preferably from 1.2 to 1.8. The length E of the inlet region ranges preferably from 100 to 2,000 μm, more preferably from 200 to 400 μm. In this context, the reader is referred to the schematic illustration in FIG. 6.

FIG. 7 shows a schematic illustration of the connection between cooler 3 and CPU 4 as well as of an interposed conductive glue layer 7 with the relevant parameters needed for defining the thermal resistance.

$T_{inlet}$ and $T_{outlet}$ thereby refer to the temperature of the coolant flowing into and respectively out of the cooler, $T_m$ a mean temperature of the coolant in the cooler, $T_{cs}$ the surface temperature of the thermal contact surface of the cooler, $T_{cpu}$ the surface temperature of the CPU and 'power' the power fed to the CPU.

To test the performance of the cooler of the invention over conventional coolers, the following tests were performed:

EXAMPLE/COMPARATIVE EXAMPLE

For optimizing the performance of the cooler of the invention, the channel width, the channel depth, the channel spacing, the residual foil thickness and the base plate thickness can be designed in accordance with the specific application, more specifically with regards to the cooling capacity to volume ratio of the micro-structured cooler and be optimized for a reference CPU having a base area of 12.0×12.0 mm and 200 W power output for example. Various key figures describing the cooling capacity of a cooler can be defined hereby.

Important influence factors are indicated in Table 1.

TABLE 1

| | |
|---|---|
| CPU power | 200 Watt |
| CPU area | 12.0 mm × 12.0 mm |
| CPU shape | square |
| Power per area of CPU | 140 Watt/cm² |
| Delivery characteristic of the pump | 60-120 liters/h at 150-300 mbar flow rate as a function of pressure |
| Power losses in the system | approx. 200 mbar |

The characteristics for the cooler are those represented for example in WO 04/032231 A.

Conventional coolers have been used for comparison (ArdexP (Ardex®: trade mark of Atotech Deutschland)) which were made like the cooler of the invention by micro-structuring Cu-sheets with parallely disposed channels contained in a plurality of channel layers and were optimized with regards to the parameters channel width b, channel depth t, channel spacing s, residual foil thickness r and thickness of the base plate g.

Power data are summarized in Table 2 showing an example opposing the cooler ArdexP and an optimized micro-structured cooler of the invention:

TABLE 2

| | Atotech ArdexP without connection and fittings | Cooler of the invention without connection and fittings |
|---|---|---|
| weight | 146 g | 26 g |
| volume | 22.5 cm³ | 3.3 cm³ |
| $R_{th\_c}$ | 0.08° C./W | 0.05° C./W |
| Flow rate | 1.2 l/min | 1.2 l/min |
| Coolant | water (50° C.) | |

The comparative tests were made at full load under identical conditions for cooling the reference CPU described in Table 1. The conditions are set forth in Table 3.

TABLE 3

ArdexP

| | |
|---|---|
| Cooler volume (without connections): W × L × H (5 cm × 5 cm × 0.9 cm) | 22.5 cm³ |
| Flow rate of the coolant | 1.2 l/min |
| Temperature difference ΔT between the cooler surface and the mean coolant temperature in the cooler | 16 K |
| Thermal resistance CPU cooler based on the mean coolant temperature in the cooler | 0.08 K/Watt |
| Compactness (cooling capacity/volume) | 8.9 Watt/cm³ |
| Cooling capacity per volume and ΔT | 0.556 Watt/(cm³·K) |
| Cooling capacity per mass | 1,369 W/kg |
| Cooling capacity per mass and ΔT | 85 W/(kg·K) |

Cooler of the Invention:

The cooler was made from a structured base plate (thickness: 0.3 mm) and eight structured foils (thickness: 0.2 mm).

TABLE 4

Geometry of the structured foils:

| | |
|---|---|
| Channel length (split design) | 2 × 7.0 mm |
| Channel width | 240 μm |
| Web width | 200 μm |
| Channel depth | 100 μm |
| Bottom sheet depth | 300 μm |
| Channel sheet depth | 200 μm |

TABLE 5

Cooler of the invention

| | |
|---|---|
| Cooler volume (without connections): W × L × H (4.2 cm × 4.2 cm × 0.19 cm) | 3.3 cm³ |
| Flow rate of the coolant | 1.2 l/min |
| Temperature difference ΔT between the cooler surface and the mean coolant temperature in the cooler | 10 K |
| Thermal resistance CPU cooler based on the mean coolant temperature in the cooler | 0.05 K/Watt |
| Compactness (cooling capacity/volume) | 60.6 Watt/cm³ |
| Cooling capacity per volume and ΔT | 6.06 Watt/(cm³·K) |
| Cooling capacity per volume and ΔT and flow rate | 5.05 Watt/(cm³·K·l/min) |
| Cooling capacity per mass | 7,700 W/kg |
| Cooling capacity per mass and ΔT | 770 W/(kg·K) |

TABLE 6

Test results - comparison between the cooler of the invention and a conventional cooler

| | ArdexP | Cooler of the invention | Difference |
|---|---|---|---|
| Thermal resistance $R_{th\_c}$ [K/W] | 0.08 | 0.05 | −0.03 (−37.5%) |
| Temperature difference [K] (at 200 W CPU power) | 16 | 10 | efficiency improved by 37.5% |
| Compactness [W/cm³] | 8.9 | 60.6 | 6.8 times higher |
| Cooling capacity per volume and ΔT and flow rate [W/(cm³·K·L/min)] | 0.463 | 5.05 | Improvement by a factor of 10.9 |
| Cooling capacity per mass (or weight) [W/kg] | 1,369 | 7,700 | better by a factor of 5.6 |
| Cooling capacity per mass (or weight) and ΔT [W/(kg·K)] | 85 | 770 | better by a factor of 9.05 |

The key figures clearly show that the cooler of the invention offers considerable advantages in all the fields.

A reduction of the thermal resistance by about 37.5% results in a clearly improved heat dissipation and an improved efficiency of the cooler. This property is particularly relevant if the computer has a high-performance CPU or is a mainframe computer with many CPUs since here, thermal outputs of several kW must be cooled.

The reduction of the temperature difference by about 6° C. results directly in energy savings in a cooling system and, as a result thereof, in savings in the operating cost. The inflow temperature of the cooling water may for example be increased by this value, thus having an extreme influence onto the efficiency of the cooling system.

The cooling capacity, based on volume, ΔT and flow rate, is greater by a factor of 10.9 over conventional coolers and shows that with these coolers considerably higher packaging densities (number of CPUs/volume unit) can be obtained.

FIG. 8 shows the thermal resistance $R_{th\_c}$ of the cooler of the invention and of the comparative cooler (ArdexP) as a function of the preset flow rate. From FIG. 8 it can be seen that under the preset boundary conditions (see also Table 2) the cooler of the invention has a considerably reduced thermal resistance in the entire flow region. At a flow rate of 1.2 liters/min, the thermal resistance could be reduced by 37.5%.

FIG. 9 shows the thermal resistance $R_{th\_c}$ of the cooler of the invention and of the comparative cooler (ArdexP) as a function of the given pressure loss. It is found that here again, the thermal resistance is improved in the entire range over the comparative cooler.

Depending on the cooling system concept and according to the corresponding pumping properties, the thermal resistance can be characterized either by FIG. 8 (the flow rate is preset) or by FIG. 9 (the pressure loss is preset).

It is obvious that the cooler of the invention has the best values for the thermal resistance at a given pressure loss inside the cooler.

At a tolerated pressure loss of for example 130 mbar, the thermal resistance of the cooler of the invention is less than 0.050 K/W, whereas the pressure loss with a prior art cooler is little less than 0.08 K/W.

It is understood that the examples and embodiments described herein are for illustrative purpose only and that various modifications and changes in light thereof as well as combinations of features described in this application will be suggested to persons skilled in the art and are to be included within the spirit and purview of the described invention and within the scope of the appended claims. All publications, patents and patent applications cited herein are hereby incorporated by reference.

LIST OF NUMERALS 1 metal foil
2, 2' channel
3 micro-structured cooler
4 CPU processor
5 base plate
6 thermal contact surface
7 TIM2 (Thermal Interface Material)
8 CPU support plate
9 web
10 splitting chamber
11 collecting chamber
12 border of the metal foil 1
13 cover plate
14 splitting element
15 inlet neck
16 outlet neck
17 quick connector
20 inlet chamber
21 outlet chamber
b channel width
$b_{10}$ gap width of the splitting chamber 10
$b_{11}$ gap width of the collecting chamber 11
t, t' channel depth
s channel spacing (web width)
r residual foil thickness
f width of the structured region of the metal foil 1
g base plate thickness
x minimum width of the inlet chamber 20
m maximum width of the inlet chamber 20
y minimum width of the outlet splitting chamber 21
n maximum width of the outlet splitting chamber 21
k funnel width at the channel inlet port
l funnel width in the region of the parallel channel walls
E depth of the funnel-shaped channel inlet

The invention claimed is:

1. A micro-structured cooler (3) for an item (4) to be cooled, comprising
   a. a stack of at least two metal foils (1), said foils having channels (2) for coolant, and of one base plate (5) adapted to be brought into thermal contact with said item (4) through a thermal contact surface (6), said metal foils (1) and said base plate (5) being joined together so as to form a single piece of material, said channels (2) having a width b ranging from 100 to 350 μm, a depth t ranging from 30 to 150 pm, a mean spacing s ranging from 30 to 300 μm, a residual foil thickness r remaining after formation of said channels (2) in said metal foils (1) ranging from 30 to 300 pm and said base plate (5) having a thickness g ranging from 100 to 1,000 μm,
   b. at least one splitting chamber (10) traversing said metal foils (1) approximately in the region of said thermal contact surface (6), said chamber communicating with a respective inlet-side end of all or of selected channels (2) through channel inlet ports,
   c. at least one inlet chamber (20) for admission of coolant into said cooler (3), said chamber communicating with said at least one splitting chamber (10),
   d. at least one collecting chamber (11) traversing the metal foils (1) and communicating with a respective outlet-side end of all or selected channels (2) through channel outlet ports and
   a at least one outlet chamber (21) for discharging coolant from said cooler (3), said chamber communicating with said at least one collecting chamber (11),
   characterized in that the cross sectional area of the channels (2) in a channel layer adjacent said base plate (5) is greater than the cross sectional area of the channels (2) in a channel layer located in the stack on the side opposite said base plate (5).

2. The cooler as set forth in claim 1, characterized in that the depth of the channels (2) in a channel layer adjacent said base plate (5) is greater than the depth of the channels (2) in a channel layer located in the stack on the side opposite said base plate (5).

3. The cooler as set forth in claim 1, characterized in that a first metal foil (1') adjacent the base plate (5) and said base plate (5) are provided with channels (2') and joined together in such a manner that the surfaces of said first metal foil (1') and of said base plate (5) comprising the channels are facing each other and that said channels (2') in said first metal foil (1') and in said base plate (5) coincide.

4. The cooler as set forth in claim 3, characterized in that the depth t of the channels formed by joining the first metal foil (1') and the base plate (5) range from 100 to 250 μm.

5. The cooler as set forth in claim 1, characterized in that the at least one inlet chamber (20) tapers toward the at least one splitting chamber (10) and that the at least one outlet chamber (21) tapers toward the at least one collecting chamber (11).

6. The cooler as set forth in claim 1, characterized in that the at least one inlet chamber (20) tapers to an outlet side width x, that the at least one splitting chamber (10) has a width $b_{10}$ and that $x \geq b_{10}$.

7. The cooler as set forth in claim 1, characterized in that the at least one outlet chamber (21) tapers to an inlet side width y, that the at least one collecting chamber (11) has a width $b_{11}$ and that $y \geq b_{11}$.

8. The cooler as set forth in claim 1, characterized in that said cooler further has at least one inlet neck (15) for admitting coolant into the cooler (3), that the at least one inlet chamber (20) has an inlet-side width m and that m is at the most equal to the width of the cross section of the at least one inlet neck (15).

9. The cooler as set forth in claim 1, characterized in that it further has an outlet neck (16) for discharging coolant from the cooler (3), that the at least one outlet chamber (21) has an outlet-side width n and that n does not exceed the width of the cross section of the at least one outlet neck (16).

10. The cooler as set forth in claim 1, characterized in that the at least one splitting chamber (10) is configured to be a gap traversing the metal foils (1) and having a width $b_{10}$.

11. The cooler as set forth in claim 1, characterized in that the at least one collecting chamber (11) is configured to be a gap traversing the metal foils (1) and having a width $b_{11}$.

12. The cooler as set forth in claim 1, characterized in that, in a respective end region located on the inlet side and extending over a length E, the channels (2) are enlarged toward the at least one splitting chamber (10).

13. The cooler as set forth in claim 12, characterized in that the ratio spacing k between the channel inlet ports to channel width b ranges from 1.1 through 3.

14. The cooler as set forth in claim 12, characterized in that the ratio spacing k between the channel inlet ports to channel width b ranges from 1.2 through 1.8.

15. The cooler as set forth in claim 12, characterized in that the length E ranges from 100 through 2,000 μm.

16. The cooler as set forth in claim 12, characterized in that the length E ranges from 200 through 400 μm.

17. The cooler as set forth in claim 1, characterized in that a ratio channel width b to mean spacing s of the channels (2) ranges from 1.5:1 through 2.5:1.

18. The cooler as set forth in claim 1, characterized in that a ratio channel width b to residual foil thickness r ranges from 2:1 through 5:1.

19. The cooler as set forth in claim 1, characterized in that the width b of the channels (2) ranges from 200 through 300 μm.

20. The cooler as set forth in claim 1, characterized in that the depth t of the channels (2) ranges from 50 through 120 μm.

21. The cooler as set forth in claim 1 characterized in that the mean spacing s between the channels (2) ranges from 150 through 300 μm.

22. The cooler as set forth in claim 1, characterized in that the residual foil thickness r ranges from 50 through 120 μm.

23. The cooler as set forth in claim 1, characterized in that the thickness g of the base plate (5) ranges from 300 through 500 μm.

24. The cooler as set forth in claim 1, characterized in that the channels (2) in the metal foils (1) form a heat exchange surface that is greater than the thermal contact surface (6).

* * * * *